(12) United States Patent
Koshihara et al.

(10) Patent No.: US 11,444,134 B2
(45) Date of Patent: Sep. 13, 2022

(54) LIGHT-EMITTING DEVICE, AND ELECTRONIC APPARATUS

(71) Applicant: SEIKO EPSON CORPORATION, Tokyo (JP)

(72) Inventors: Takeshi Koshihara, Matsumoto (JP); Jun Irobe, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 193 days.

(21) Appl. No.: 16/936,591

(22) Filed: Jul. 23, 2020

(65) Prior Publication Data

US 2021/0028238 A1  Jan. 28, 2021

(30) Foreign Application Priority Data

Jul. 24, 2019  (JP) .............................. JP2019-135923

(51) Int. Cl.
*H01L 27/32* (2006.01)

(52) U.S. Cl.
CPC ........ *H01L 27/322* (2013.01); *H01L 27/3218* (2013.01)

(58) Field of Classification Search
CPC ......... H01L 27/0207; H01L 21/823821; H01L 21/823871; H01L 27/0924; G06F 30/394
See application file for complete search history.

(56) References Cited

U.S. PATENT DOCUMENTS

| 2005/0073230 | A1 | 4/2005 | Nishikawa et al. |
| 2008/0143649 | A1* | 6/2008 | Asaki .................. H01L 51/5209 345/76 |
| 2014/0167604 | A1* | 6/2014 | Iwata ..................... H05B 33/22 313/504 |
| 2016/0240591 | A1 | 8/2016 | Song et al. |
| 2017/0236464 | A1 | 8/2017 | Koshihara |

FOREIGN PATENT DOCUMENTS

| JP | 2005-129510 A | 5/2005 |
| JP | 2017-146372 A | 8/2017 |
| JP | 2019-054006 A | 4/2019 |

* cited by examiner

*Primary Examiner* — Karen Kusumakar
*Assistant Examiner* — Adam S Bowen
(74) *Attorney, Agent, or Firm* — Oliff PLC

(57) ABSTRACT

A light-emitting device includes a semi-transmissive reflection layer, a first reflection layer that is disposed in a first sub-pixel, a first pixel electrode that is disposed in the first sub-pixel, a first color filer that is disposed in the first sub-pixel, a second reflection layer that is disposed in a second sub-pixel, a second pixel electrode that is disposed in the second sub-pixel, a second color filter that is disposed in the second sub-pixel, the second color filter that is same color as the first color filter, a light-emitting functional layer, and an insulating layer that is disposed between the first reflection layer and the first pixel electrode, the light-emitting functional layer that is disposed between the second reflection layer and the second pixel electrode. A thickness of the insulating layer in the second sub-pixel is thicker than a thickness of the insulating layer in the first sub-pixel.

7 Claims, 18 Drawing Sheets

LIGHT-EMITTING DEVICE, AND ELECTRONIC APPARATUS

The present application is based on, and claims priority from JP Application Serial Number 2019-135923, filed Jul. 24, 2019, the disclosure of which is hereby incorporated by reference herein in its entirety.

BACKGROUND

1. Technical Field

The present disclosure relates to a light-emitting device, a method for manufacturing the light-emitting device, and an electronic apparatus including the light-emitting device.

2. Related Art

Known display devices include an organic electroluminescent (EL) element and a color filter for transmitting light in a predetermined wavelength range. For example, the display device in JP-A-2017-146372 includes an organic EL element, a reflective layer and a common electrode that functions as a semi-transmissive reflective layer, and has a resonance structure configured to resonate light emitted from the organic EL element. Specifically, the optical path length between the reflective layer and the common electrode is optimized for each color light of R, G and B to increase intensity of the light in wavelengths of each color through interference and improve light extraction efficiency. Note that the resonance structure is set in common across display surfaces for each color light.

In JP-A-2017-146372, the display device is used as a head mounted display (HMD). The HMD includes an optical system with a projector lens and a user is shown a virtual image by enlarging an image on the display device. HMDs of this type are required to be downsized to increase comfort for the user. Thus, display devices are being made smaller and in higher definition. However, in order to achieve a large virtual image on a small display device, the angle of view needs to be increased.

In a typical display device such as that disclosed in JP-A-2017-146372, extraction efficiency may decrease and chromaticity may shift as the principal ray tilts (see FIG. 15 of JP-A-2017-146372). When the principal ray tilts, the optical path length and the phase condition for reflection change, and this causes the resonance wavelength to shift and chromaticity to change. When the angle of view in the display device is increased, a change in chromaticity is noticeable at peripheral edge portions of the display area of the display device. Thus, typical display devices have insufficient visual field angle characteristics, which is a problem.

SUMMARY

A light-emitting device according to the present application is a light-emitting device including a first sub-pixel and a second sub-pixel in a display region, the light-emitting device including a reflective layer, a semi-transmissive reflective layer, and a light-emitting functional layer provided between the reflective layer and the semi-transmissive reflective layer, the light-emitting device further including an optical resonance structure in which light radiated from the light-emitting functional layer resonates between the reflective layer and the semi-transmissive reflective layer, wherein a wavelength range of light, emitted by the first sub-pixel and the second sub-pixel, from the optical resonance structure is a first wavelength range, and moreover the light-emitting device further including a pixel electrode provided between the reflective layer and the light-emitting functional layer, and an insulating layer provided between the reflective layer and the pixel electrode, wherein the insulating layer in the second sub-pixel is thicker than the insulating layer in the first sub-pixel.

A light-emitting device including a first sub-pixel and a second sub-pixel in a display region, the light-emitting device including a reflective layer, a semi-transmissive reflective layer, and a light-emitting functional layer provided between the reflective layer and the semi-transmissive reflective layer, the light-emitting device further including an optical resonance structure in which light radiated from the light-emitting functional layer resonates between the reflective layer and the semi-transmissive reflective layer, wherein a wavelength range of light, emitted by the first sub-pixel and the second sub-pixel, from the optical resonance structure is a first wavelength range, and moreover the light-emitting device further including a pixel electrode provided between the reflective layer and the light-emitting functional layer, and an insulating layer provided between the reflective layer and the pixel electrode, wherein a wavelength range of light emitted at a predetermined tilt angle from the second sub-pixel matches a wavelength range of light emitted in a vertical direction from the first sub-pixel.

The insulating layer preferably includes a first layer formed of a first material and a second layer formed of a second material, which is different from the first material, and the first layer in the second sub-pixel is preferably thicker than the first layer in the first sub-pixel.

The first sub-pixel is preferably disposed in a reference area serving as a reference in the display region, and the second sub-pixel is preferably disposed in an area, which is different from the reference area.

An electronic apparatus includes the above-described light-emitting device.

DESCRIPTION OF EXEMPLARY EMBODIMENTS

1. First Embodiment

Overview of Light-Emitting Device

Figure 1:
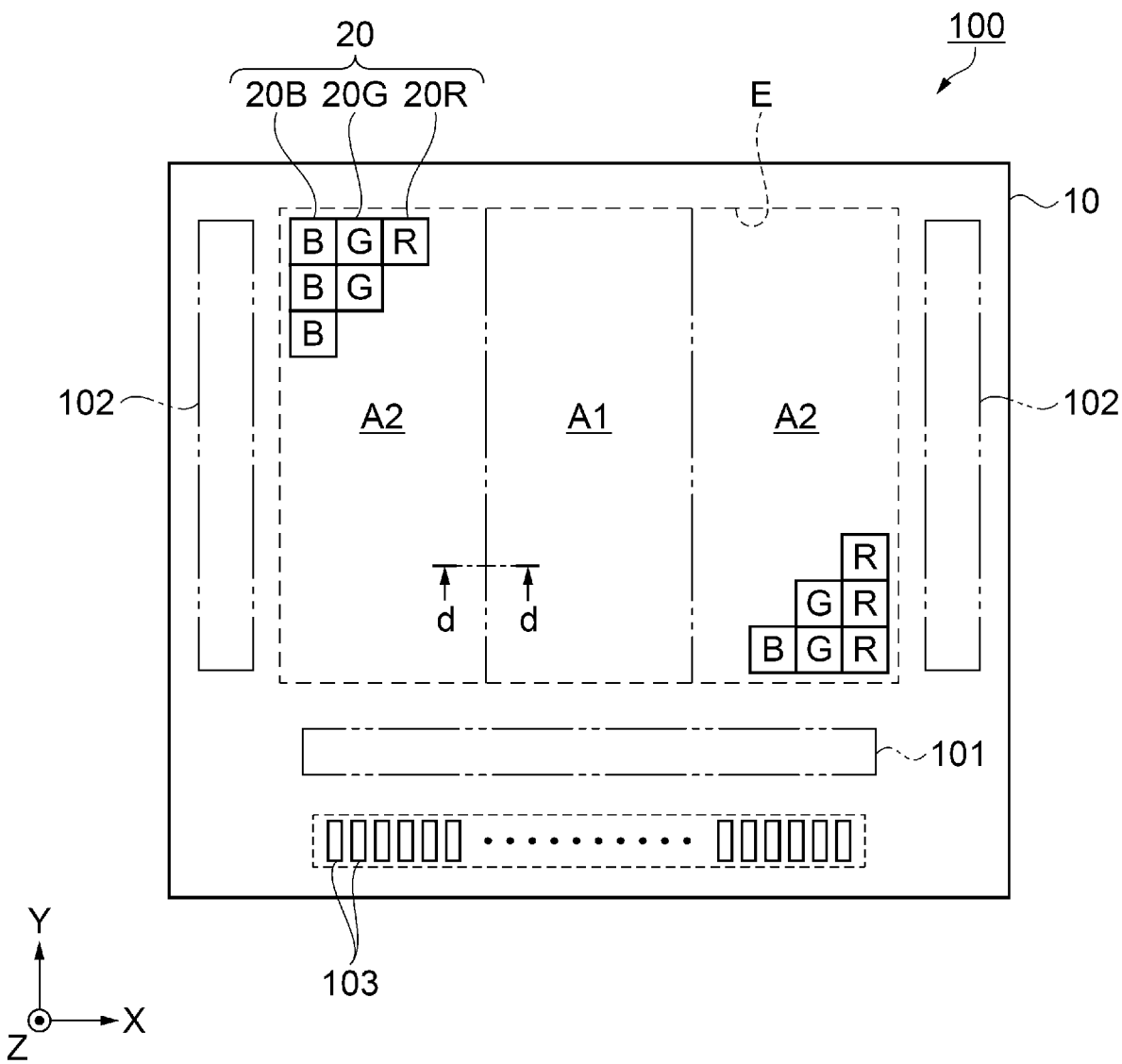
FIG. 1 is a schematic plan view illustrating a configuration of an organic EL device according to a first embodiment.
Figure 2:
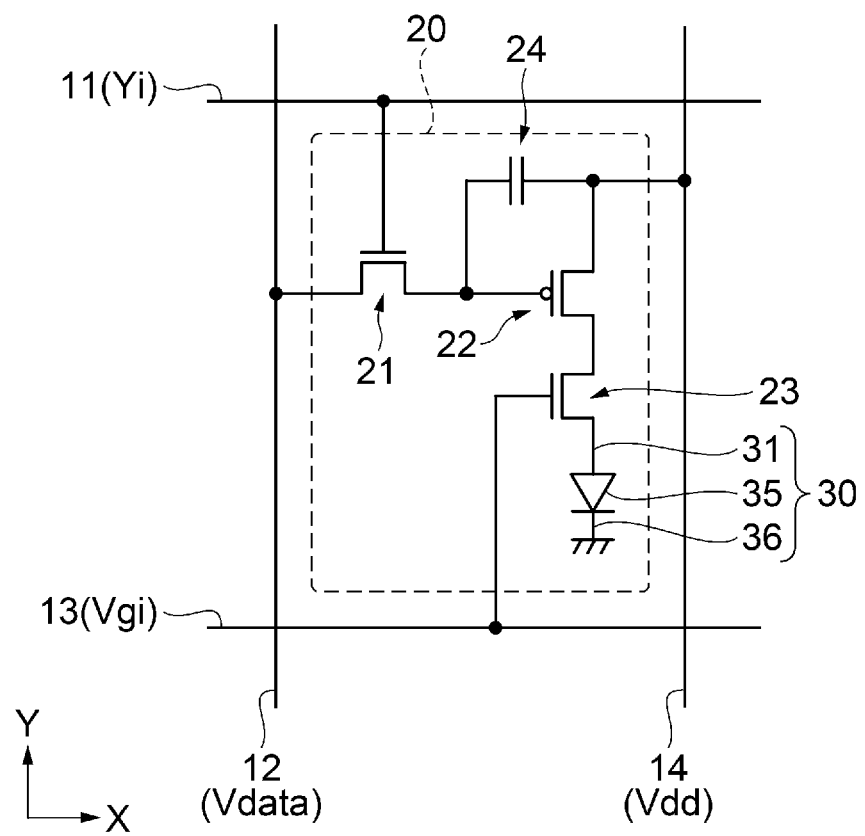
FIG. 2 is an equivalent circuit diagram illustrating an electrical configuration of a light-emitting pixel in the organic EL device.
Figure 3:
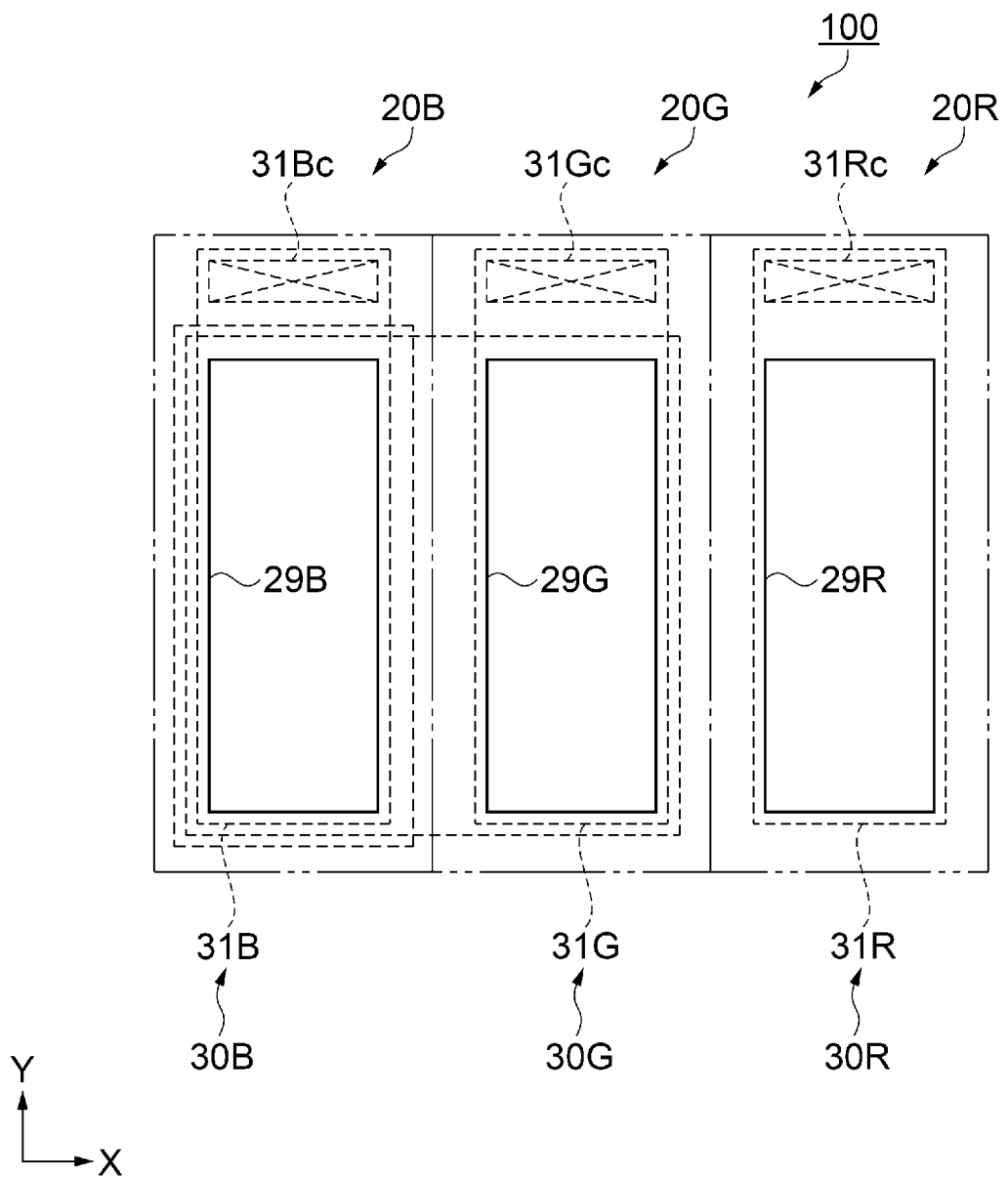
FIG. 3 is a schematic plan view illustrating a configuration of a light-emitting pixel.

First, an organic EL device as an example of a light-emitting device according to this embodiment will be described with reference to FIGS. 1 to 3. FIG. 1 is a schematic plan view illustrating a configuration of the organic EL device. FIG. 2 is an equivalent circuit diagram illustrating an electrical configuration of a light-emitting pixel in the organic EL device. FIG. 3 is a schematic plan view illustrating a configuration of a light-emitting pixel in the organic EL device.

As illustrated in FIG. 1, an organic EL device 100 as an example of a light-emitting device includes an element substrate 10, a plurality of light-emitting pixels 20 arranged in a matrix in a display region E of the element substrate 10, a data line drive circuit 101 and a scanning line drive circuit 102 as peripheral circuits that drive and control the plurality of light-emitting pixels 20, and a plurality of external connection terminals 103 used to electrically couple the organic EL device 100 to an external circuit. The organic EL device 100 according to the present embodiment is an active driven and top-emitting light-emitting device. Note that the display region E may also be referred to as a display surface E.

A light-emitting pixel 20B that emits blue light (B), a light-emitting pixel 20G that emits green light (G), and a light-emitting pixel 20R that emits red light (R) are disposed in the display region E. In FIG. 1, light-emitting pixels 20 that emit the same color light are arranged in the vertical direction and light-emitting pixels 20 that emit different color light are arranged repeatedly in the order of B, G and R in the lateral direction. Such an arrangement of light-emitting pixels 20 is referred to as a stripe arrangement. The arrangement of the light-emitting pixels 20 is not limited to this arrangement. For example, the arrangement of light-emitting pixels 20 that emit different color light in the lateral direction does not need to be in the order of B, G and R, and may be in the order of R, G and B, for example. In the following description, the vertical direction along which the light-emitting pixels 20 that emit the same color light are arranged is described as a Y direction, and a direction orthogonal to the Y direction is described as an X direction. A view of the element substrate 10 from a light extraction direction of the light-emitting pixels 20 is described as a plan view. Note that three adjacent sub-pixels of B, G and R constitute one pixel in a display unit.

A detailed configuration of the light-emitting pixel 20 is given below. Each of the light-emitting pixels 20B, 20G and 20R according to the present embodiment includes an organic electroluminescent element as a light-emitting element, and a color filter corresponding to each color of B, G, and R. Light emitted from the organic EL element is converted into the colors B, G, and R to enable full color display. Note that the organic electroluminescent element is referred to as an organic EL element.

In addition, each light-emitting pixel 20B, 20G and 20R is built with an optical resonance structure that enhances brightness in a specific wavelength within a wavelength range of light emitted from the organic EL element.

In the organic EL device 100, the light-emitting pixels 20B, 20G and 20R function as sub-pixels, and one pixel unit in the image display consists of the three light-emitting pixels 20B, 20G and 20R that emit light corresponding to B, G and R, respectively. Note that the light-emitting pixels 20B, 20G and 20R may also be referred to as a blue sub-pixel, a green sub-pixel and a red sub-pixel, respectively. In addition, these sub-pixels may be collectively referred to as "color sub-pixels". Note that the pixel unit is not limited to this configuration and may include a light-emitting pixel 20 that emits light of a color other than B, G and R (including white).

The display region E is divided into two regions. Specifically, the center of the display region E corresponds to an area A1 as a reference area and either side of the area A1 in the X direction corresponds to an area A2. In other words, the display region E is divided into vertical stripe display areas in the order of the area A2, the area A1, and the area A2 along the X direction. Note that a sub-pixel disposed in the reference area A1 corresponds to a first sub-pixel. A sub-pixel disposed in the area A2 closer to the periphery than the area A1 corresponds to a second sub-pixel. The first sub-pixel and the second sub-pixel emit the same color light. The configuration of the sub-pixel differs between the area A1 and the area A2, and this will be described in detail below.

The plurality of external connection terminals 103 are provided along a first side portion of the element substrate 10 and are aligned in the X direction. The data line drive circuit 101 is disposed between the external connection terminals 103 and the display region E in the Y direction and extends in the X direction. Further, a pair of the scanning line drive circuits 102 are provided sandwiching the display region E in the X direction.

As described above, in the display region E, a plurality of the light-emitting pixels 20 are provided in a matrix. As illustrated in FIG. 2, the element substrate 10 is provided with a scanning line 11, a data line 12, a lighting control line 13 and a power source line 14 as signal lines corresponding to the light-emitting pixels 20.

In the present embodiment, the scanning line 11 and the lighting control line 13 extend in parallel with the X direction, and the data line 12 and the power source line 14 extend in parallel with the Y direction.

In the display region E, a plurality of the scanning lines 11 and a plurality of the lighting control lines 13 are provided corresponding to m-rows in the plurality of light-emitting pixels 20 arranged in a matrix. Each scanning line 11 and each lighting control line 13 is coupled to a pair of the scanning line drive circuits 102 illustrated in FIG. 1. A plurality of the data lines 12 and a plurality of the power source lines 14 are provided corresponding to n-columns in the plurality of light-emitting pixels 20 arranged in a matrix. Each of the plurality of data lines 12 is coupled to the data line drive circuit 101 illustrated in FIG. 1, and each of the plurality of power source lines 14 is coupled to any one of the plurality of external connection terminals 103.

The pixel circuit of each light-emitting pixel 20 is made up of a first transistor 21, a second transistor 22, a third transistor 23, a storage capacitor 24, and an organic EL element 30 serving as a light-emitting element, and these components are provided near an intersection between the scanning line 11 and the data line 12.

The organic EL element 30 includes a pixel electrode 31 that is an anode, a cathode 36 that is a cathode, and a functional layer 35 that includes a light-emitting layer and is interposed between these two electrodes. The cathode 36 is an electrode provided in common across the plurality of light-emitting pixels 20. A reference potential Vss or a GND potential that is lower than a power supply voltage Vdd applied to the power source line 14 is applied to the cathode 36.

The first transistor 21 and the third transistor 23 are, for example, n-channel transistors. The second transistor 22 is, for example, a p-channel transistor.

The gate electrode of the first transistor 21 is coupled to the scanning line 11, one current terminal of the first transistor 21 is coupled to the data line 12, and the other current terminal of the first transistor 21 is coupled to the gate electrode of the second transistor 22 and one electrode of the storage capacitor 24.

One current terminal of the second transistor 22 is coupled to the power source line 14 and the other electrode of the storage capacitor 24. The other current terminal of the second transistor 22 is coupled to one current terminal of the third transistor 23. In other words, the second transistor 22 and the third transistor 23 share one current terminal of a pair of current terminals.

The gate electrode of the third transistor 23 is coupled to the lighting control line 13 and the other current terminal of the third transistor 23 is coupled to the pixel electrode 31 of the organic EL element 30. In the pairs of current terminals in each of the first transistor 21, the second transistor 22 and the third transistor 23, one current terminal is a source and the other is a drain.

In such a pixel circuit, the n-channel first transistor 21 enters an ON state when the voltage level of a scanning signal Yi supplied from the scanning line drive circuit 102 to the scanning line 11 reaches a Hi level. The data line 12 and the storage capacitor 24 are electrically coupled to each other when the first transistor 21 is in the ON state. Then, when a data signal is supplied from the data line drive circuit 101 to the data line 12, the potential difference between a voltage level Vdata of the data signal and a power supply voltage Vdd applied to the power source line 14 is stored in the storage capacitor 24.

When the voltage level of the scanning signal Yi supplied to the scanning line 11 from the scanning line drive circuit 102 reaches a Low level, the n-channel first transistor 21 enters an OFF state and a gate-source voltage Vgs of the second transistor 22 is held at the voltage obtained when the voltage level Vdata is applied. After the scanning signal Yi reaches the Low level, the voltage level of a lighting control signal Vgi supplied to the lighting control line 13 reaches the Hi level and the third transistor 23 enters the ON state. In this way, current corresponding to the gate-source voltage Vgs of the second transistor 22 flows between the source and the drain of the second transistor 22. Specifically, this current flows along a path from the power source line 14 to the organic EL element 30 via the second transistor 22 and the third transistor 23.

The organic EL element 30 emits light according to the magnitude of current flowing through the organic EL element 30. The current flowing through the organic EL element 30 is determined based on operating points of the second transistor 22 and the organic EL element 30 set by the voltage Vgs between the gate and the source of the second transistor 22. The voltage Vgs between the gate and the source of the second transistor 22 is the voltage held in the storage capacitor 24 due to a potential difference between the voltage level Vdata of the data line 12 and the power supply voltage Vdd when the scanning signal Yi is at the Hi level. The emission brightness of the light-emitting pixel 20 is defined by the length of time that the voltage level Vdata in the data signal and the third transistor 23 are in the ON state. In other words, the value of the voltage level Vdata in the data signal may provide brightness gradation according to image information in the light-emitting pixel 20 and enable full color display.

Note that in the present embodiment, the pixel circuit of the light-emitting pixel 20 is not limited to having the three transistors 21, 22 and 23 and need only be a pixel circuit capable of displaying and driving a light-emitting pixel. For example, the pixel circuit may have a circuit configuration that uses two transistors. The transistors constituting the pixel circuit may be n-channel transistors, p-channel transistors, or may include both an n-channel transistor and a p-channel type transistor. In other words, the transistors constituting the pixel circuit of the light-emitting pixel 20 may be MOS transistors having an active layer in the semiconductor substrate, thin-film transistors, or field-effect transistors.

As illustrated in FIG. 3, each of the light-emitting pixels 20B, 20G and 20R is rectangular in plan view and is disposed such that the longitudinal direction thereof is aligned with the Y direction. Each of the light-emitting pixels 20B, 20G and 20R is provided with the organic EL element 30 having the equivalent circuit illustrated in FIG. 2. To distinguish between the organic EL elements 30 provided in the light-emitting pixels 20B, 20G and 20R, the organic EL elements 30 may be referred to as an organic EL element 30B, an organic EL element 30G, and an organic EL element 30R, respectively. In order to distinguish between the pixel electrodes 31 in the organic EL elements 30 for each of the light-emitting pixels 20B, 20G, and 20R, the pixel electrodes 31 may be referred to as a pixel electrode 31B, a pixel electrode 31G and a pixel electrode 31R, respectively.

The light-emitting pixel 20B is provided with the pixel electrode 31B and a contact portion 31Bc that electrically couples the pixel electrode 31B and the third transistor 23. Similarly, the light-emitting pixel 20G is provided with the pixel electrode 31G and a contact portion 31Gc that electrically couples the pixel electrode 31G and the third transistor 23. The light-emitting pixel 20R is provided with the pixel electrode 31R and a contact portion 31Rc that electrically couples the pixel electrode 31R and the third transistor 23. The pixel electrodes 31B, 31G and 31R are substantially rectangular in plan view. Each of the contact portions 31Bc, 31Gc and 31Rc is disposed on an upper side of each pixel electrode 31B, 31G and 31R in the longitudinal direction, respectively.

Each of the light-emitting pixels 20B, 20G and 20R has an insulated structure in which adjacent pixel electrodes 31 are electrically insulated from each other and openings 29B, 29G and 29R that define regions in contact with a functional layer are formed on the pixel electrodes 31B, 31G and 31R, respectively. Note that in the present embodiment, the openings 29B, 29G and 29R have the same shape and size.

Structure of Pixel

Figure 4:
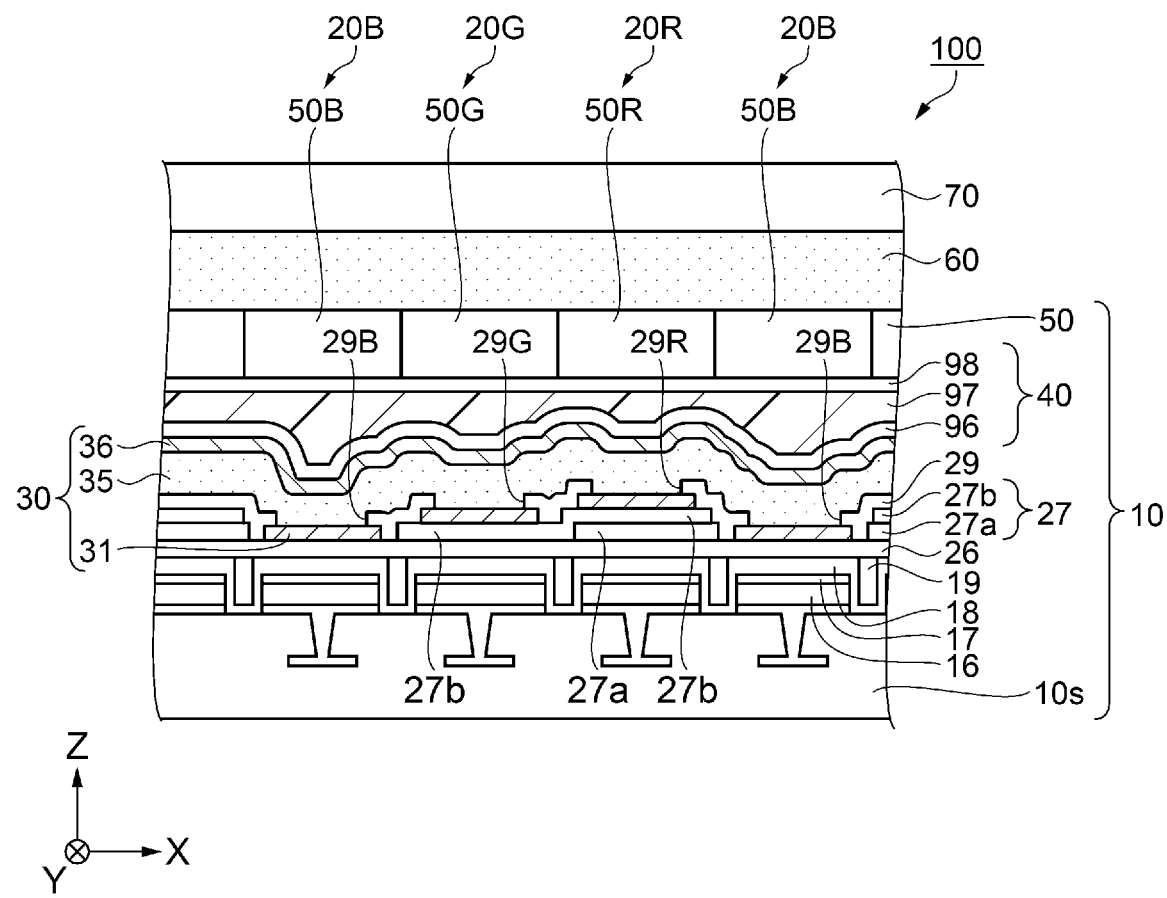
FIG. 4 is a schematic cross-sectional view of a light-emitting pixel taken along the X direction.

FIG. 4 is a schematic cross-sectional view of a light-emitting pixel taken along the X direction. FIG. 4 is a cross-sectional view of a pixel in the area A1 in FIG. 1.

Next, the configuration of the light-emitting pixel 20 will be described with reference to FIG. 4. Note that the pixel circuit, which includes the transistors and other components, illustrated in FIG. 3 is not shown in FIG. 4.

As illustrated in FIG. 4, the organic EL device 100 includes the element substrate 10 formed with the light-emitting pixels 20B, 20G 20R, a color filter 50 and other components, and a transparent sealing substrate 70. The element substrate 10 and the sealing substrate 70 are bonded together by a resin layer 60 having both adhesive and transparent properties.

The color filter 50 includes filter layers 50B, 50G and 50R corresponding to the colors B, G and R, respectively. The filter layers 50B, 50G and 50R are disposed on the element substrate 10 corresponding to the light-emitting pixels 20B, 20G and 20R, respectively.

The organic EL device 100 has a top-emitting structure in which emitted light is extracted from the sealing substrate 70 side, and light emitted from the functional layer 35 passes through any one of the corresponding filter layers 50B, 50G and 50R and exits from the sealing substrate 70 side.

In the present embodiment, a silicon substrate is used as a base material 10s of the element substrate 10. Note that, an opaque ceramic substrate or semiconductor substrate may be used because a top-emitting structure is employed.

A pixel circuit layer including the above-described transistors and connection wiring such as contact portions, a reflective electrode 16, a reflectance-enhancing layer 17, a first protective layer 18, an embedded insulating layer 19, a second protective layer 26, an adjustment layer 27, the organic EL element 30, a pixel separation layer 29, an sealing layer 40, the color filter 50, and other components are formed on the base material 10s. Note that this pixel circuit layer is not shown in FIG. 4.

The reflective electrode 16 also functions as a reflective layer in the optical resonance structure and is formed of a material having light reflectivity and conductivity. For example, metals such as aluminum (Al) and silver (Ag), and alloys of these metals, can be used. In this embodiment, a Ti/Al—Cu alloy is used, and an Al—Cu alloy is used as a reflective surface that reflects light. The reflective electrode 16 is flat and is formed wider than each of the openings 29B, 29G and 29R in each pixel.

The reflectance-enhancing layer 17 is a silicon oxide layer formed on the reflective electrode 16 and functions as a reflectance-enhancing layer that improves light reflectance. The reflectance-enhancing layer 17 is used as a hard mask for patterning in a step for forming the reflective electrode 16. In this step, when the reflective electrode 16 is divided into pixels, grooves are formed around the periphery of the pixels. In other words, as illustrated in FIG. 4, a groove is provided between the reflective electrode 16 of a certain light-emitting pixel 20 and the reflective electrode 16 of a light-emitting pixel 20 adjacent to that light-emitting pixel 20.

The first protective layer 18 is a silicon nitride layer formed on the reflectance-enhancing layer 17 and is formed on the inner surface of the grooves that divide the pixels. For example, a plasma CVD method is used to form the reflectance-enhancing layer 17.

The embedded insulating layer 19 is a silicon oxide layer used to fill and flatten the grooves that divide the pixels. For example, a high density plasma CVD method is used to form the embedded insulating layer 19. The silicon oxide layer is formed on the reflectance-enhancing layer 17 to fill the grooves that divide the pixels. Then, a resist is selectively formed on top portions of the grooves and the entire surface is etched. At this time, the first protective layer 18 is exposed by using the first protective layer 18 as an etch stopper, and the grooves are filled with the embedded insulating layer 19 and flattened.

The second protective layer 26 is a silicon nitride layer formed on the first protective layer 18 and the embedded insulating layer 19. The second protective layer 26 also functions as an adjustment layer for optical path length and is used to adjust the length of the optical path in the optical resonance structure. The second protective layer 26 corresponds to a first layer of the insulating layer and silicon nitride corresponds to a first material. For example, a plasma CVD method is used to form the second protective layer 26.

The adjustment layer 27 is an adjustment layer for optical path length and is used to adjust the length of the optical path in the optical resonance structure. The adjustment layer 27 corresponds to a second layer of the insulating layer and is composed of silicon oxide as a second material different to the first material. A different number of the adjustment layers 27 are formed depending on the color light emitted by the light-emitting pixel. In the light-emitting pixel 20G, one adjustment layer 27 is formed on the second protective layer 26. In the light-emitting pixel 20R, two adjustment layers 27 are formed on the second protective layer 26. In the light-emitting pixel 20B, no adjustment layer is formed on the second protective layer 26 and the pixel electrode 31 is formed directly on the second protective layer 26. Note that the second protective layer 26, which also functions as an optical adjustment layer, may also be referred to as a first adjustment layer. The adjustment layer 27 may also be referred to as a second adjustment layer. These components will be described in detail later.

The pixel separation layer 29 is formed between adjacent pixel electrodes 31 and partitions the openings 29B, 29G and 29R of the pixels. Silicon oxide is used for the pixel separation layer 29.

The organic EL element 30 is configured to sandwich the functional layer 35 between the pixel electrode 31 and the cathode 36.

The pixel electrode 31 is a transparent anode and is formed from a transparent conductive film having light transmittance and conductivity. Indium tin oxide (ITO) is used as a suitable example. After forming the film using, for example, sputtering, the pixel electrode 31 is partitioned into sub-pixels through patterning. Note that the functional layer 35 will be described later.

The cathode 36 is a cathode that also functions as a semi-transmissive reflective layer in the optical resonance structure. In the present embodiment, a Mg—Ag alloy semi-transmissive reflective thin film in which Mg and Ag are co-deposited is used for the cathode 36.

The sealing layer 40 includes a first inorganic sealing layer 96, an organic intermediate layer 97 and a second inorganic sealing layer 98.

The first inorganic sealing layer 96 is made of a material having excellent gas barrier properties and transparency and is formed to cover the cathode 36. For example, an inorganic compound such as a metal oxide, for example, silicon oxide, silicon nitride, silicon oxynitride, and titanium oxide is used to form the first inorganic sealing layer 96. As a suitable example, silicon oxynitride is used for the first inorganic sealing layer 96.

The organic intermediate layer 97 is a transparent organic resin layer formed over the first inorganic sealing layer 96. As a suitable example, epoxy resin is used as the material of the organic intermediate layer 97. The material is applied by a printing method or a spin coating method and cured to cover and flatten foreign material and projections and depressions on the surface of the first inorganic sealing layer 96.

The second inorganic sealing layer 98 is an inorganic compound layer formed over the organic intermediate layer 97. Similar to the first inorganic sealing layer 96, the second inorganic sealing layer 98 has both transparency and gas barrier properties and is formed using an inorganic compound having excellent water resistance and heat resistance. As a suitable example, silicon oxynitride is used for the second inorganic sealing layer 98.

The color filter 50 is formed on the second inorganic sealing layer 98 having a flattened surface. Each of the filter layers 50B, 50G and 50R of the color filter 50 is formed by applying, exposing and developing a photosensitive resin containing a pigment corresponding to each color.

Optical Resonance Structure

Figure 5A:
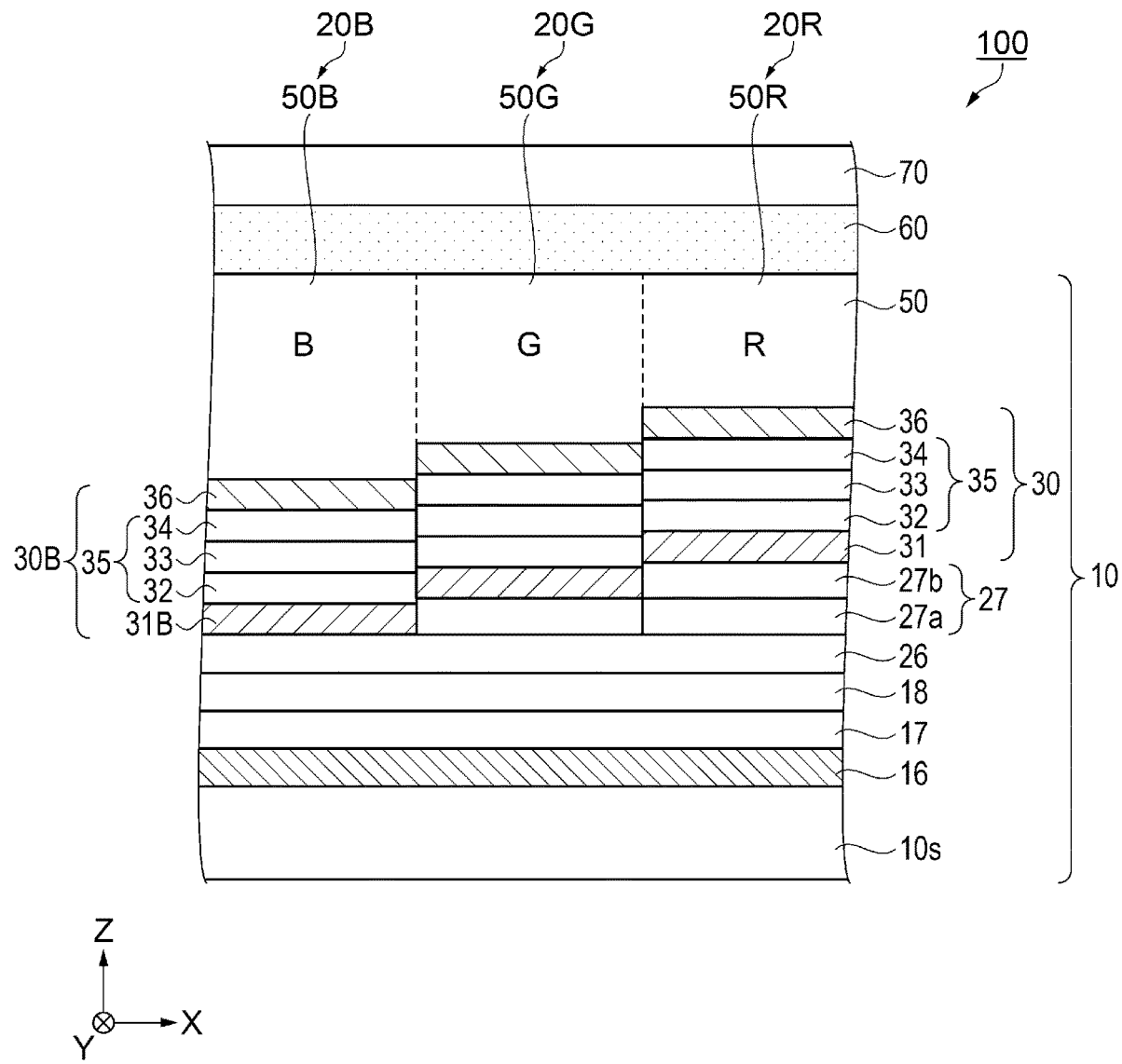
FIG. 5A is a schematic cross-sectional view illustrating an optical resonance structure in a light-emitting pixel.

FIG. 5A is a schematic cross-sectional view illustrating an optical resonance structure in the light-emitting pixel and corresponds to FIG. 4. Next, the optical resonance structure in the organic EL device 100 and the configuration of the organic EL element 30 will be described with reference to FIG. 5A.

As described above, the organic EL element 30 has a configuration in which the functional layer 35 is sandwiched between the pixel electrode 31 and the cathode 36.

The functional layer 35 is an organic light-emitting layer including a hole injecting layer (HIL) 32, an organic light-emitting layer (EML) 33 and an electron transport layer (ETL) 34, which are stacked in the stated order from the pixel electrode 31 side. The organic light-emitting layer 33 corresponds to a light-emitting functional layer. Each of these layers is formed using, for example, a vapor deposition method. Applying drive potential between the pixel electrode 31 and the cathode 36 causes holes to be injected into the functional layer 35 from the pixel electrode 31 and electrons to be injected into the functional layer 35 from the cathode 36. In the organic light-emitting layer 33 included in the functional layer 35, excitons are formed by the injected holes and electrons. When the excitons decay, some of the resulting energy is radiated as fluorescence or phosphorescence. Note that, in addition to the hole injecting layer 32, the organic light-emitting layer 33 and the electron transport layer 34, the functional layer 35 may include a hole transport layer, an electron injecting layer, or an intermediate layer that improves or controls injectability and transport of the holes or electrons injected into the organic light-emitting layer 33.

When drive voltage is applied to the organic EL element 30, the organic light-emitting layer 33 emits white light. White light can be also obtained by combining organic light-emitting layers that emit blue (B) light, green (G) light and red (R) light, respectively. Further, a pseudo-white light can be obtained by combining organic light-emitting layers that emit blue (B) light and yellow (Y) light, respectively. The functional layer 35 is formed in common across the light-emitting pixels 20B, 20G and 20R.

Here, in the organic EL element 30, by adopting the optical resonance structure between the reflective electrode 16 as a reflective layer and the cathode 36 as a semi-transmissive reflective layer, light is emitted at a stronger brightness in resonance wavelengths corresponding to the light emitted in the colors of B, G and R.

The resonance wavelength for each of the light-emitting pixels 20B, 20G and 20R in the optical resonance structure is determined based on the optical distance between the reflective electrode 16 and the cathode 36 and, specifically, is set to satisfy the following Equation (1). Hereinafter, the optical distance is also referred to as an optical path length D.

$$\text{Optical path length } D = \{(2\pi m + \varphi L + \varphi U)/4\pi\}\lambda \qquad (1)$$

where m is 0 or a positive integer, $\varphi L$ is the phase shift in reflection at the reflective electrode 16, $\varphi U$ is the phase shift in reflection at the cathode 36, and $\lambda$ is the peak wavelength of the standing wave.

The optical distance of each layer in the optical resonance structure is represented by the product of the thickness of each layer through which light is transmitted and the refractive index.

Equation (1) is a basic equation for when the principal ray is oriented in a direction perpendicular to the display surface and does not assume a case where the principal ray is tilted. In particular, when the angle of view is increased in a downsized display device, the angle of the principal ray increases at peripheral edge portions of the display area and the optical path length increases. As a result, a shift in chromaticity occurs. In light of this, the present inventors have devised an adjustment method for optical path length in accordance with Equation (1), taking into account the angle of view. Prior to a specific description of the adjustment method, problems of the related art will be described.

Angle of View and Adjustment Layer

Figure 6A:
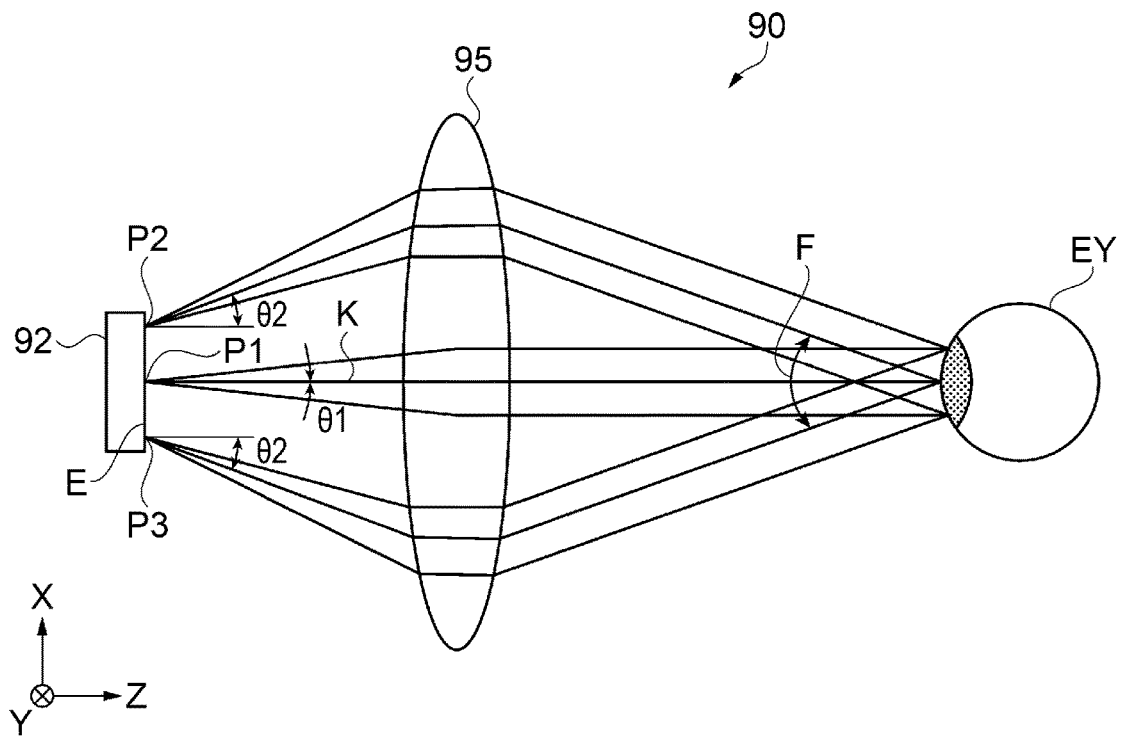
FIG. 6A is a schematic diagram illustrating an optical system of an apparatus that displays a virtual image.
Figure 6B:
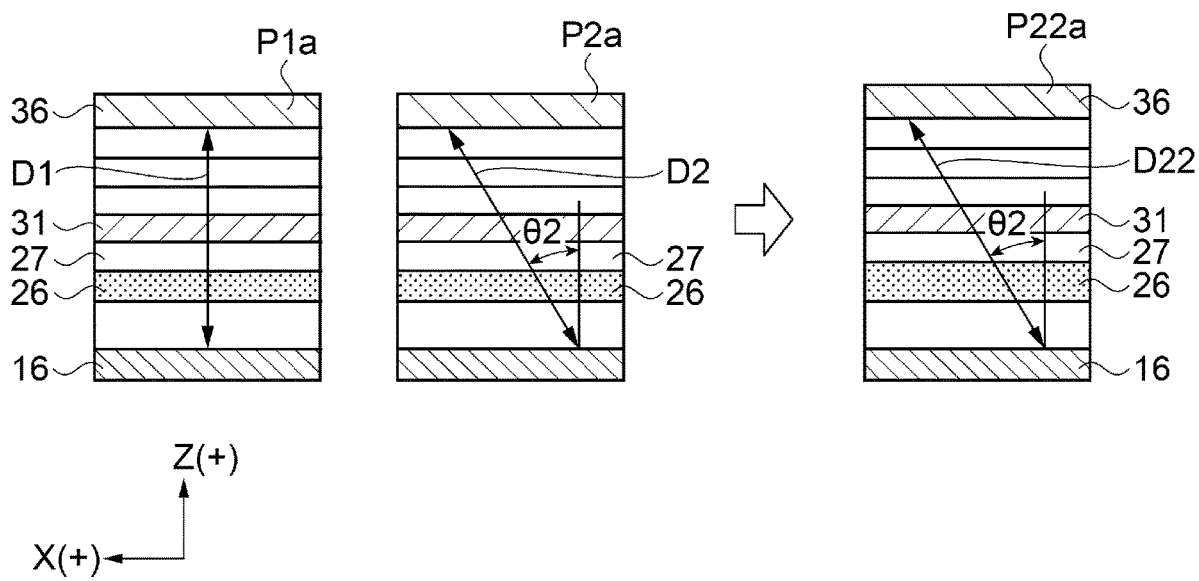
FIG. 6B is a schematic cross-sectional view of a sub-pixel.

FIG. 6A is a schematic diagram illustrating an optical system of an apparatus that displays a virtual image. FIG. 6A is a side view of an optical system 90 when viewed along the direction of travel of image light. FIG. 6B is a schematic cross-sectional view of a sub-pixel.

The optical system 90 is an optical system that can be provided in a camera viewfinder or an HMD. In the present embodiment, the optical system 90 will be described as an optical system of an HMD.

The optical system 90 includes a display device 92 and an eyepiece 95. The display device 92 is an organic EL panel and has a planar size smaller than the planar area of the eyepiece 95. This is due to the fact that the HMD is to be mounted on a head and is required to be small and lightweight for comfortable wear. The eyepiece 95 is a convex lens.

The image displayed on the display device 92 is magnified by the eyepiece 95 and is incident on an eye EY as image light. The image light is a luminous flux centered on an optical axis K that extends perpendicularly from the center of the display surface E of the display device 92. As illustrated in FIG. 6A, the image light expands from the display surface E at a wide angle to converge at the eyepiece 95 and enter the eye EY. The optical axis K is a straight line that passes through the center of the eyepiece 95 from the center of the display surface E to the center of the eye EY.

The eye EY is shown a virtual image formed by the image light that is magnified by the eyepiece 95. Note that various other lenses, light guides and other components may be provided between the eyepiece 95 and the eye EY.

In this optical system, an angle of view F needs to be increased in order to obtain a large virtual image. In order to increase the angle of view F by using the display device 92, which has a smaller planar area than the eyepiece 95, the angle of the principal ray needs to be increased.

The principal ray will now be described. The principal ray is, among the luminous flux emitted from the pixel, the central axis of luminous flux that are primarily used in the applicable optical system. For example, in a sub-pixel P1 located substantially at the center of the display surface E, the principal ray is light along the optical axis K and an angle θ1 at which the principal ray is tilted is approximately 0°. Similarly, in a sub-pixel P2 located at an end of the display surface E in the +X direction, the principal ray is tilted at an angle θ2 that expands outward of the optical axis K. Similarly, in a sub-pixel P3 located at an end of the display surface E in the −X direction, the principal ray is tilted at the angle θ2 that expands outward of the optical axis K on a side opposite to the sub-pixel P2. Note that the angle θ2 depends on the application but is generally from 10° to 25°.

Thus, in order to increase the angle of view F by using a small display device 92, the angles of the principal rays of sub-pixels located closer to ends of the display surface need to be increased. When increasing the angles of the principal rays, there is a problem in that chromaticity shift occurs when the display device 92 is regarded as a typical display device.

A cross-sectional view P1a in FIG. 6B is a schematic cross-sectional view illustrating the sub-pixel P1 substantially at the center of the display surface E. Because the angle θ1 of the principal ray is approximately 0° in the sub-pixel P1, an optical path length D1 in the optical resonance structure is set to a length corresponding to one adjustment layer 27 based on the Equation (1). In the sub-pixel P1, chromaticity shift does not occur. Note that the sub-pixels P1, P2 and P3 are described as green pixels.

On the other hand, as illustrated in the cross-sectional view P2a in FIG. 6B, in the sub-pixel P2 located at the end of the display surface E, the optical path length is an optical path length D2 longer than the optical path length D1 because the angle θ2 of the principal ray is larger than the angle θ1 but the optical path length is set the same as the sub-pixel P1. Thus, an optical path length setting that satisfies the optical resonance condition with the optical path length D1 involves the principal ray being tilted to achieve the optical path length D2, and causing a color shift due to resonating at a wavelength different from that of a target wavelength.

In light of this, the organic EL device 100 according to the present embodiment adopts an adjustment method for optical path length that takes into account the angle of view.

A cross-sectional view P22a in FIG. 6B is a schematic cross-sectional view illustrating a sub-pixel P22 located at an end of the display surface E in the organic EL device 100. Note that the organic EL device 100 and the display device 92 are the same size, and that the sub-pixel P22 corresponds to the sub-pixel P2.

The angle θ2 of the principal ray of the sub-pixel P22 is the same as that of the sub-pixel P2, but chromaticity shift is suppressed through thickening the second protective layer 26 functioning as a first adjustment layer to increase the optical path length so as to satisfy the optical resonance condition. Specifically, by thickening the second protective layer 26 and making the optical path length an optical path length D22 that is longer than the optical path length D2, it is possible to satisfy the optical resonance condition even at end portions and peripheral edge portions of the display surface E.

As a result, light emitted from the sub-pixel P22 as a second sub-pixel at the predetermined tilt angle θ2 has the adjusted optical path length D22 and is therefore green light that satisfies the optical resonance conditions. The same applies to red and blue light. In the optical system 90 of FIG. 6A, employing the organic EL device 100 according to the present embodiment as the display device 92 achieves effects such as increasing the angle of view F and reducing the size of the optical system 90. Details of the adjustment method for optical path length will be described later.

Correlation Between Principal Ray Angle and Correction Film Thickness

Figure 7:
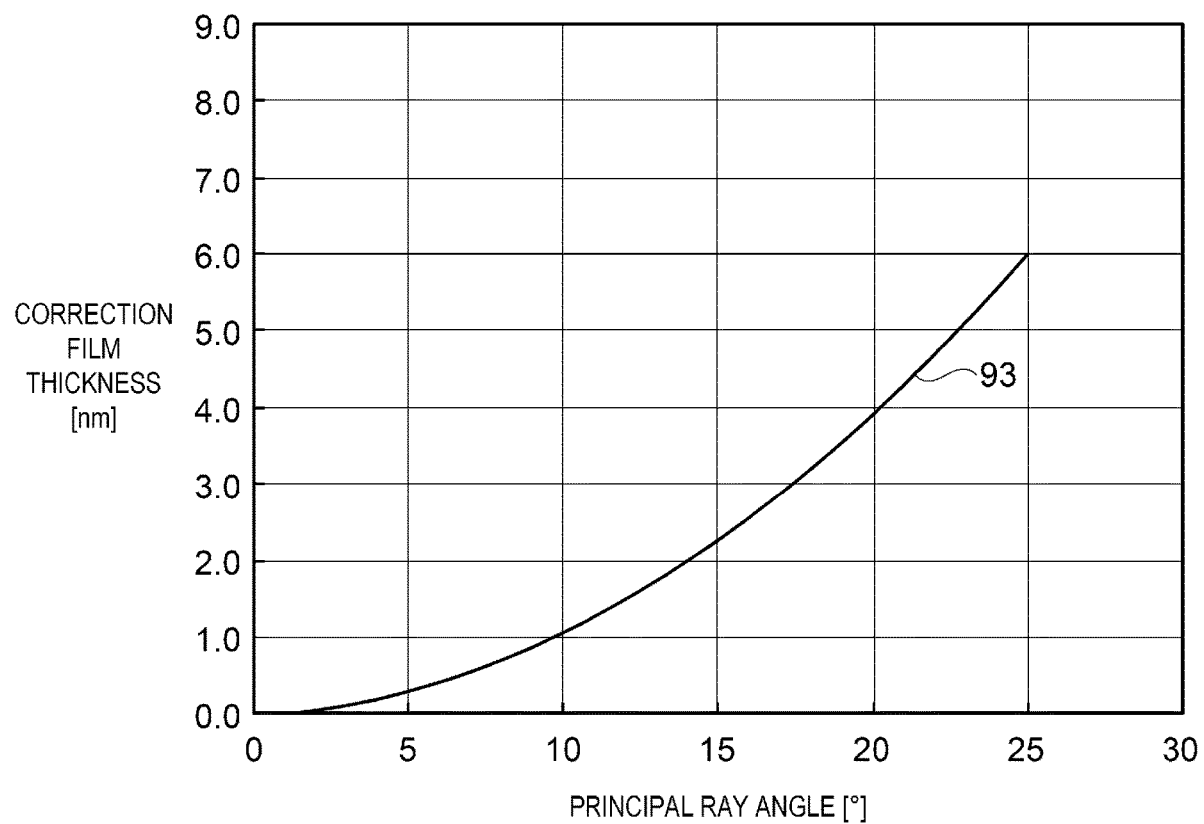
FIG. 7 is a graph showing correlation between a principal ray angle and correction film thickness.

FIG. 7 is a graph showing correlation between principal ray angle and correction film thickness. In FIG. 7, the horizontal axis represents the angle (°) of the principal ray and the vertical axis represents the thickness (nm) of the correction film.

Curve 93 is a graph showing results of simulation, based on Equation (1), of correlation between principal ray angle and correction film thickness in the second protective layer 26 made of silicon nitride.

Curve 93 shows the correlation between the angle of the principal ray in a green sub-pixel and correction film thickness required to achieve an appropriate optical path length for optical resonance at that angle. As shown in curve 93, it is understood that correction film thickness exhibits quadratic growth as the principal ray angle increases.

For example, if the angle of the principal ray in a green sub-pixel is 20°, it is required that the thickness of the second protective layer 26 be increased by +4.0 nm. Note that a reference layer thickness for the second protective layer 26 is a thickness in a case where the angle of the principal ray in a green sub-pixel is 0°.

Note that a green sub-pixel has been described as a typical sub-pixel, but results of simulation conducted by the present inventors show that the correlation for blue and red is the same as that for green. In other words, the thickness of the second protective layer 26 is set by determining the required correction film thickness according to the principal ray angle based on the curve 93 in each of green, blue and red sub-pixels.

More specifically, when the display region E is divided into a plurality of areas according to the principal ray angle, the thickness of the second protective layer 26 is set in common for all of green, blue and red sub-pixels by determining the correction film thickness according to the principal ray angle for each area from the curve 93. In other words, setting the thickness of the second protective layer 26 for each area based on the curve 93 makes it possible to achieve an optical path length that satisfies optical resonance.

Figure 5B:
FIG. 5B is a table of examples of thicknesses of an adjustment layer and associated layers.

FIG. 5B is a table of examples of thicknesses of an adjustment layer and associated layers. Table 39 in FIG. 5B corresponds to FIG. 5A and shows examples of the thickness of the second protective layer 26 and the thickness of associated layers related to the optical resonance structure in the areas A1 and A2.

Here, the thickness of the second protective layer 26 and the thickness of the associated layers in a green sub-pixel according to a preferred example will be described. Table 39 shows examples of the material, refractive index and thickness of each of portion in the preferred example. Note that the materials and numbers are not limited to those shown and may be set as appropriate according to the application of the organic EL device 100, specifications including the size, and other factors.

As shown in Table 39, in the area A1 where the angle of the principal ray is 0°, the thickness of the second protective layer 26 functioning as a first adjustment layer in the green sub-pixel is set to 50 nm. This value is set according to the material and refractive index of each layer in the optical resonance structure based on Equation (1). The thickness of the second protective layer 26 in the reference area A1 is a reference layer thickness. In the green sub-pixel, one adjustment layer 27 is formed as a second adjustment layer. The thickness of this layer is 50 nm.

Here, the angle of the principal ray in the area A2 is 20°. In curve 93, if the angle of the principal ray is 20°, the correction film thickness is +4.0 nm. Thus, as shown in Table 39, in the area A2 where the angle of the principal ray is 20°, the thickness of the second protective layer 26 functioning as a first adjustment layer in the green sub-pixel is set to the reference layer thickness 50 nm+the correction film thickness 4.0 nm=54 nm. The thickness of the adjustment layer 27 is 50 nm and is the same as in area A1. Note that the second protective layer 26 is composed of silicon nitride having a higher refractive index than silicon oxide. Thus, the required optical distance can be ensured with a correction film thickness smaller than that of silicon oxide.

Return to FIG. 6B.

The green sub-pixel in area A1 in Table 39 of FIG. 5B corresponds to the sub-pixel P2 in FIG. 6B. Similarly, the green sub-pixel in area A2 corresponds to the sub-pixel P22 in FIG. 6B.

As illustrated in the cross-sectional view P22a in FIG. 6B, light emitted from the sub-pixel P22 in the area A2 at a predetermined tilt angle θ2 (20°) is green light that satisfies optical resonance conditions because the thickness of the second protective layer 26 is set thick at 54 nm.

Return to FIG. 4.

A green sub-pixel has been described as a typical sub-pixel, but the same applies to blue and red sub-pixels and the thickness of the second protective layer 26 need only be set based on the curve 93. However, as illustrated in FIG. 4, the thickness of the adjustment layer 27 as the second adjustment layer is different for each color light. Specifically, no adjustment layer is formed in the blue light-emitting pixel 20B, and hence the thickness is 0 nm. Two adjustment layers 27 are formed in the red light-emitting pixel 20R, and hence the thickness is 100 nm. The difference in thickness of the second adjustment layer (adjustment layer 27) for each color light is common across all display areas. On the other hand, the thickness of the first adjustment layer (second protective layer 26) is different for each display area.

Method for Manufacturing Optical Path Adjustment Layer—1

Figure 8:
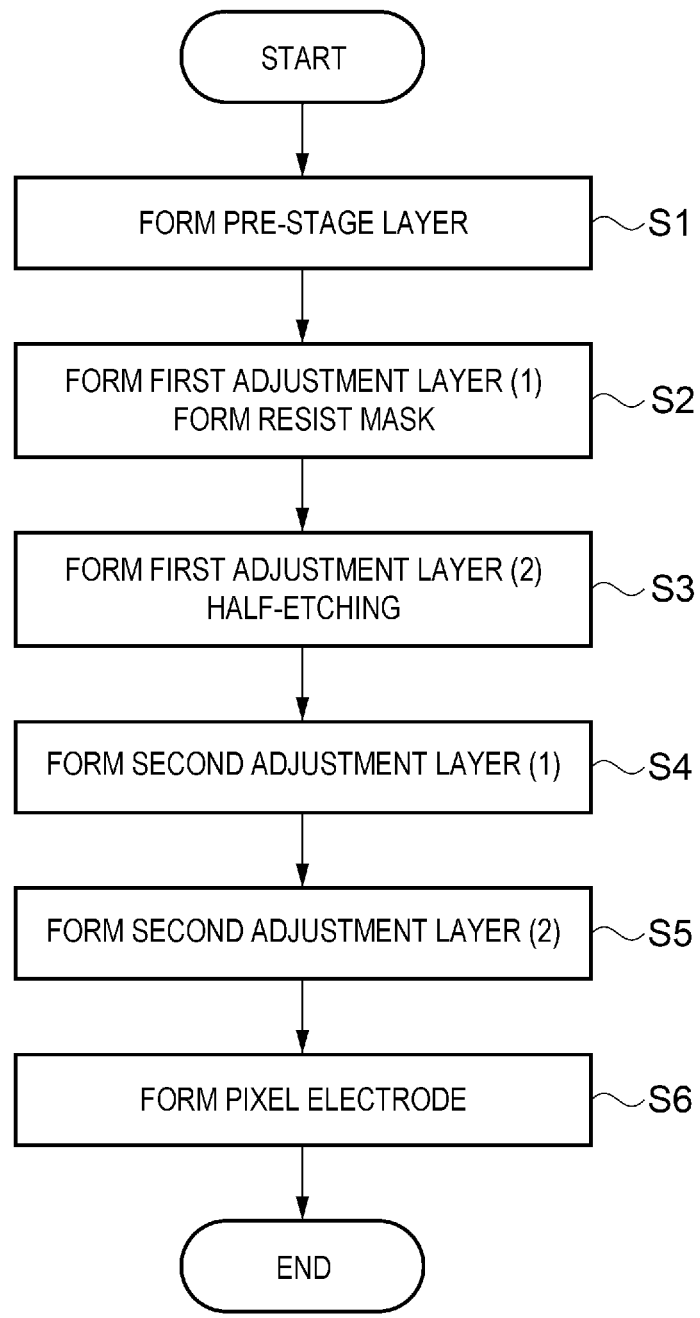
FIG. 8 is a process flow chart illustrating a flow of manufacturing an optical path adjustment layer.
Figure 9:
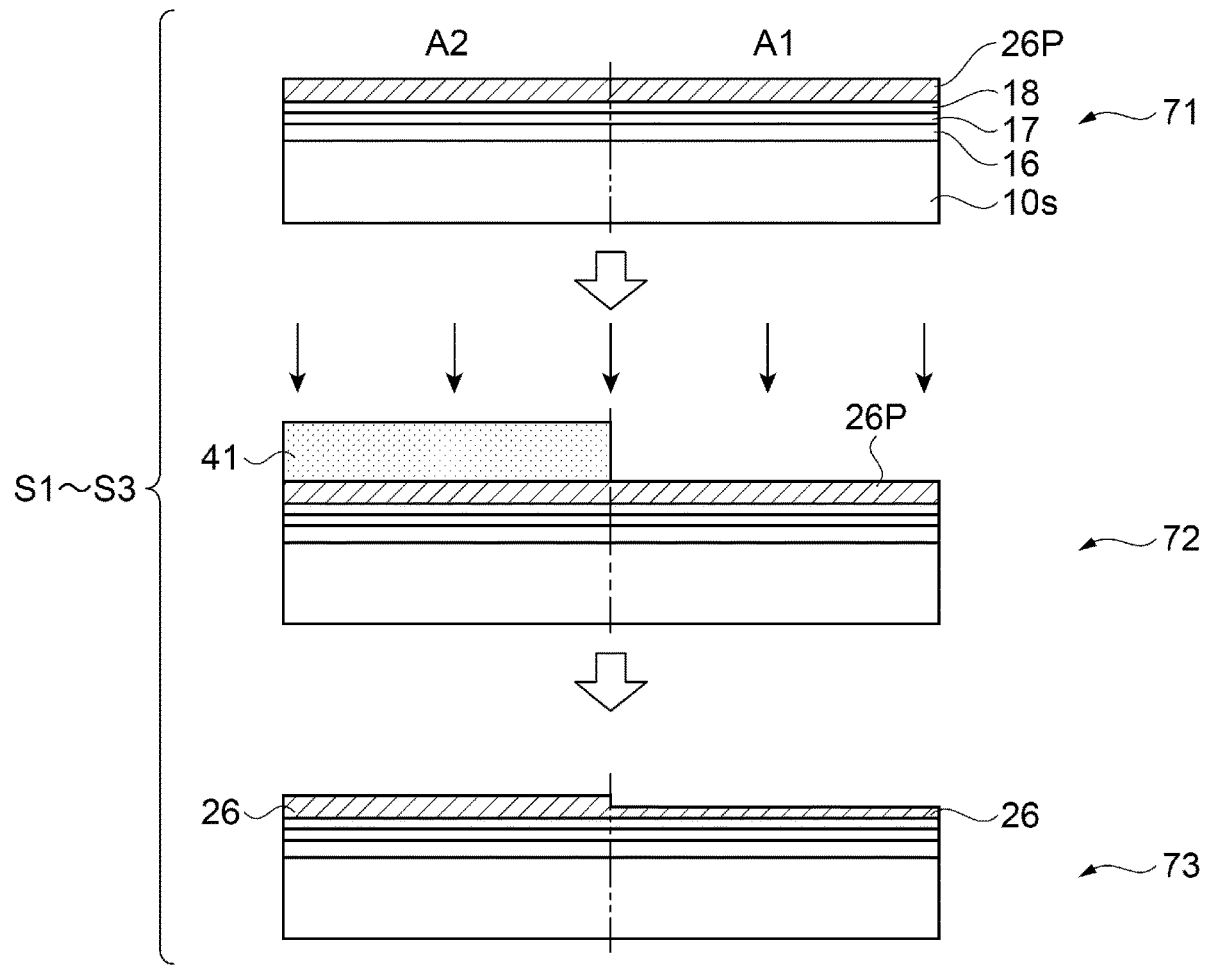
FIG. 9 is a cross-sectional view illustrating a manufacturing process in one step.
Figure 10:
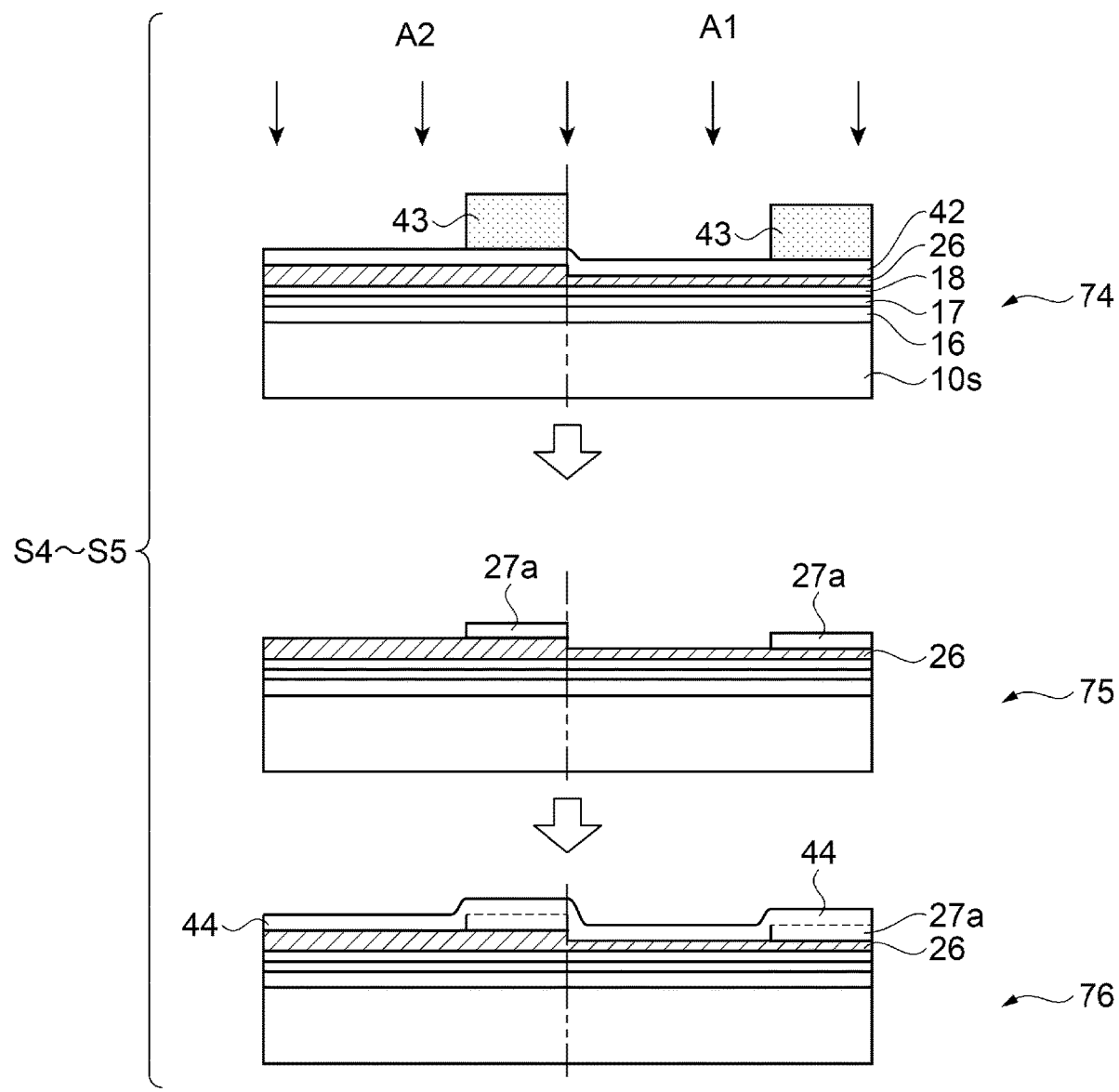
FIG. 10 is a cross-sectional view illustrating a manufacturing process in one step.
Figure 11:
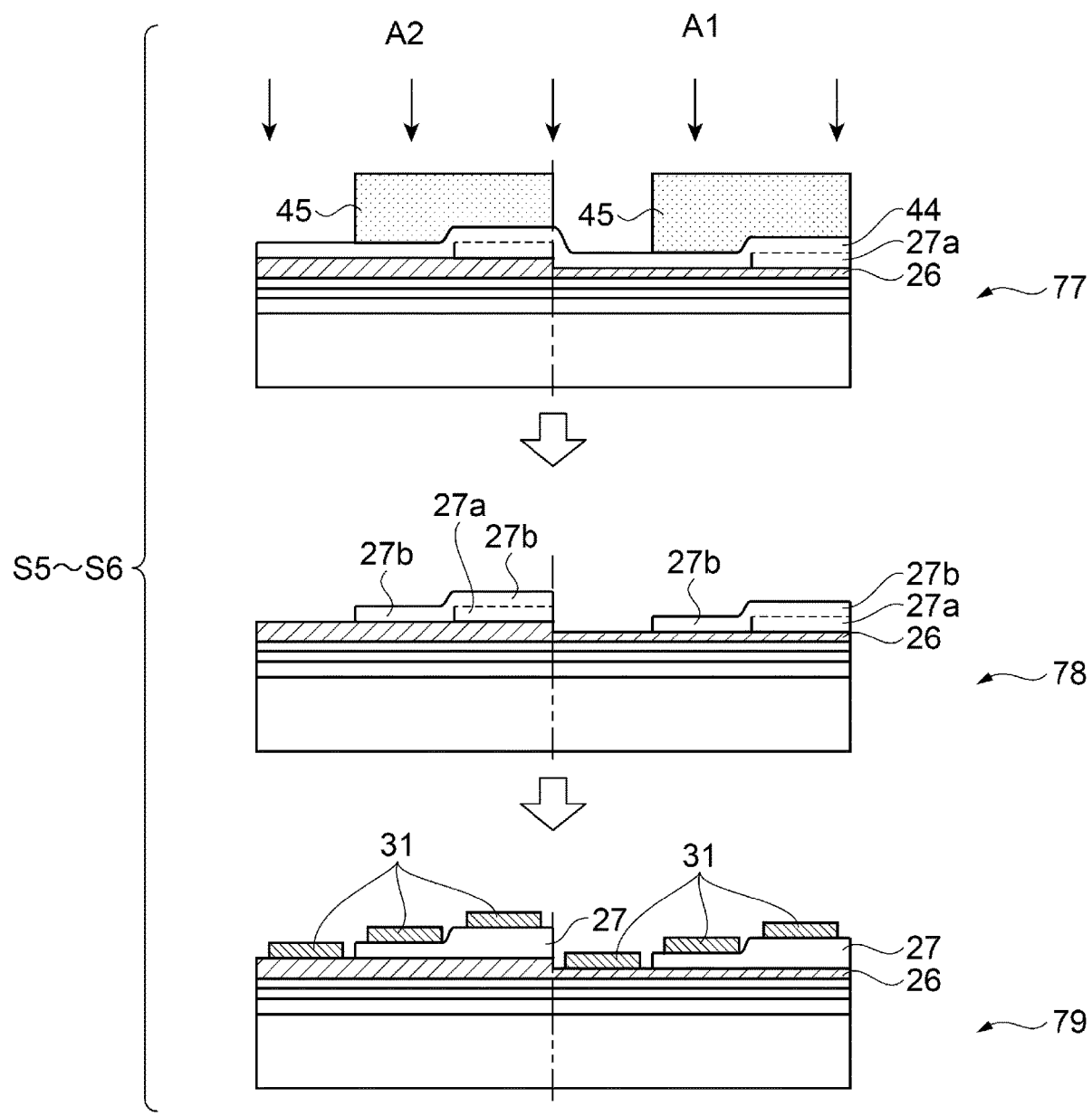
FIG. 11 is a cross-sectional view illustrating a manufacturing process in one step.

FIG. 8 is a process flow chart illustrating a flow of manufacturing an optical path adjustment layer. FIGS. 9 to 11 are cross-sectional views illustrating manufacturing processes in individual steps.

First, a completed state where components until a pixel electrode have been formed will be described with reference to FIG. 11. The process diagram 79 of FIG. 11 shows a cross section d-d taken along a boundary portion between the area A1 and the area A2 in the display region E in FIG. 1. As described above, because the angle of the principal ray is larger in area A2 than in area A1, the second protective layer 26 functioning as a first adjustment layer is thicker in area A2 than in area A1.

The adjustment layer 27 functioning as a second adjustment layer is formed in the shape of steps on the second protective layer 26 in the area A1 in order from 0 to 2 layers. A portion where the second protective layer 26 is exposed corresponds to 0 layers and corresponds to a blue sub-pixel. A portion provided with one adjustment layer 27 corresponds to a green sub-pixel and a portion provided with two adjustment layers 27 corresponds to a red sub-pixel. Similarly, the adjustment layer 27 is formed in the shape of steps on the second protective layer 26 in the area A2 in order from 0 to 2 layers.

In other words, a step-shaped second adjustment layer is formed on the first adjustment layer that is adjusted in thickness for each display area in the order of 0 layers to 2 layers, and a pixel electrode 31 is formed on the second adjustment layer.

A method for manufacturing the first adjustment layer and the second adjustment layer up to the process diagram 79 will be described below with reference to FIG. 8 and FIGS. 9 to 11.

First, the process diagram 71 in FIG. 9 illustrates a case where each layer until the first protective layer 18 that serves as the foundation of the adjustment layer is formed on the base material 10s.

In Step S1, a material layer 26p is formed to fill spaces on the entire surface of the first protective layer 18. The material layer 26p is a silicon nitride layer and is formed in a preparation step before etching is performed. The material layer 26p corresponds to a preliminary step layer of a first layer of the insulating layer. The material layer 26p is formed using a plasma CVD method, for example. The thickness of the material layer 26p is based on the graph in FIG. 7 and is a thickness obtained by adding the correction film thickness in the area where the angle of the principal ray is largest. In other words, the thickness of the material layer 26p is set to the film thickness in an area with the thickest layer thickness. For example, if the angle of the principal ray in the area A2 is 20°, the thickness of the material layer 26p is 54 nm. The process diagram 71 illustrates a state where the material layer 26p is formed.

First, in Step S2, a photosensitive resist layer is formed to fill spaces on the entire surface of the material layer 26p. Then, as illustrated in the process diagram 72, the resist layer is exposed and developed to form a resist mask 41 having a predetermined opening. In the present embodiment, because there are two display areas, the opening of the resist mask 41 is a portion of the area A1.

Next, in Step S3, the resist mask 41 and the material layer 26p are subjected to half-etching. Specifically, a fluorine-based treatment gas is used to perform dry etching. At this time, the material layer 26p is etched by a required amount through reliable time management. For example, in the area A1, etching is ended at a time where the etching amount is 4 nm. Note that the etching time is an appropriate time setting based on multiple pieces of experimental data. The remaining resist mask 41 is then asked.

As a result, as illustrated in the process diagram 73, the second protective layer 26 functioning as a first adjustment layer is formed to have a different thickness according to the display area. In the present embodiment, the thickness of the second protective layer 26 is 50 nm in the area A1 and 54 nm in the area A2. This is the same as Table 39 in FIG. 5B. Note that the silicon nitride constituting the second protective layer 26 corresponds to a first material and is different to a second material constituting the adjustment layer 27. The silicon oxide formed in the following Step S4 is the second material.

In Step S4, a first layer of the second adjustment layer is formed. First, a material layer 42 is formed to fill spaces on the entire surface of the second protective layer 26. The material layer 42 is a silicon oxide layer and is formed using CVD, for example. The material layer 42 corresponds to a preliminary step layer of a second layer of the insulating layer.

Next, a photosensitive resist layer is formed to fill spaces on the entire surface of the material layer 42. Then, as illustrated in the process diagram 74 in FIG. 10, the resist layer is exposed and developed to form a resist mask 43 having a predetermined opening. The opening of the resist mask 43 is a portion corresponding to a blue sub-pixel and a green sub-pixel.

Next, the resist mask 43 and the material layer 42 are subjected to dry etching. Specifically, the material layer 42 exposed through the opening via the resist mask 43 is dry-etched. At this time, the second protective layer 26 formed of silicon nitride functions as an etch stopper because the second protective layer 26 has a slower etching rate in dry etching than the silicon oxide of the material layer 42. In other words, this difference in etching selectivity is used to make the second protective layer 26 an etch stop film for dry etching.

As a result, as illustrated in the process diagram 75, an adjustment layer 27a serving as the first layer of the second adjustment layer is selectively formed on the second protective layer 26 at a portion corresponding to a red sub-pixel.

In Step S5, a second layer of the second adjustment layer is formed. First, as illustrated in the process diagram 76, a material layer 44 is formed to fill spaces on the entire surfaces of the adjustment layer 27a and the second protective layer 26. The material layer 44 is a silicon oxide layer and is formed using CVD, for example. The material layer 44 corresponds to a preliminary step layer of the second layer of the insulating layer.

Next, a photosensitive resist layer is formed to fill spaces on the entire surface of the material layer 44. Then, as illustrated in the process diagram 77 in FIG. 11, the resist layer is exposed and developed to form a resist mask 45 having a predetermined opening. The opening of the resist mask 45 is a portion corresponding to a blue sub-pixel.

Next, the resist mask 45 and the material layer 44 are subjected to dry etching. Specifically, similar to Step S4, the material layer 44 exposed through the opening via the resist mask 45 is dry-etched with the second protective layer 26 as an etch stop film. As a result, as illustrated in the process diagram 78, an adjustment layer 27b is formed on the adjustment layer 27a and a portion of the second protective layer 26. With the processes described above, a 0-layer portion where the second protective layer 26 is exposed and 1- and 2-layer portions where there are one and two adjustment layers 27 are selectively formed separately.

In Step S6, the pixel electrode 31 is formed. As illustrated in the process diagram 79, a transparent electrode film is formed through sputtering on the adjustment layer 27b and the second protective layer 26 and patterned to form the pixel electrode 31 on the exposed portion of the second protective layer 26 and the 1- to 2-layer portions of the adjustment layer 27. ITO is used as the material for the pixel electrode 31. The 0-layer portion without the adjustment layer is a blue sub-pixel, the 1-layer portion is a green sub-pixel, and the 2-layer portion is a red sub-pixel.

Method for Manufacturing Optical Path Adjustment Layer—2

In the manufacturing method described above, an example has been described where there are two display areas and the thickness of the first adjustment layer is in two stages. However, there may be three or more display areas. Even in this case, the thickness of the first adjustment layer can be adjusted in three or more stages by repeating Steps S2 and S3 of the flowchart in FIG. 8.

Figure 12:
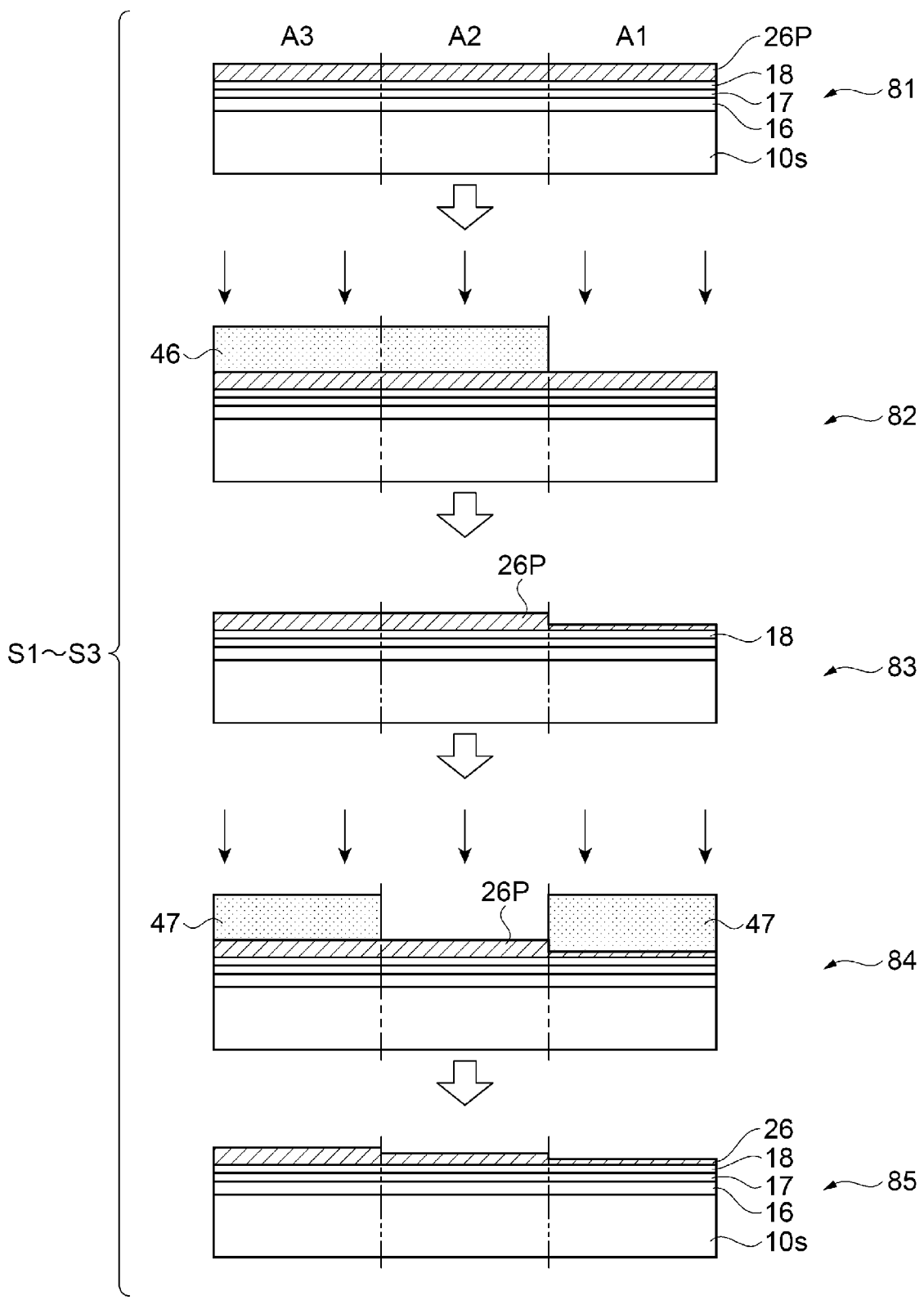
FIG. 12 is a cross-sectional view illustrating a manufacturing process in one step.

FIG. 12 corresponds to FIG. 9 and is a cross-sectional view illustrating steps of a manufacturing process in a case where there are three display areas. The same components as those described above are given the same reference signs, and redundant descriptions of these components will be omitted. This method will be mainly described with reference to FIG. 12 and reference to FIG. 8 as appropriate.

In FIG. 12, the display area is divided into three areas A1, A2 and A3. The angle of the principal ray in the area A1 is set to 0°, the angle of the principal ray in the area A2 is set to 15°, and the angle of the principal ray in the area A3 is set to 20°.

As in the process diagram 81, in Step S1, the material layer 26p is formed to fill spaces on the entire surface of the first protective layer 18. The material layer 26p is a silicon nitride layer and is formed using the same method as described above. The thickness of the material layer 26p is based on the graph in FIG. 7 and is set to a thickness of 54 nm obtained by adding correction film thickness in the area A3 where the angle of the principal ray is greatest.

First, a first round of the Steps S2 and S3 will be described.

In Step S2, a photosensitive resist layer is formed to fill spaces on the entire surface of the material layer 26p. Then, as illustrated in the process diagram 82, the resist layer is exposed and developed to form a resist mask 46 having a predetermined opening. In the present embodiment, because there are three display areas, the opening in the resist mask 46 corresponds to a portion of the area A1.

In Step S3, the resist mask 46 and the material layer 26p are subjected to dry etching. Specifically, a fluorine-based treatment gas is used to perform dry etching. At this time, the material layer 26p is etched by a required amount through reliable time management. Specifically, the etching is complete at a time when the etching amount in the area A1 is 4 nm. The remaining resist mask 46 is then asked.

As a result, as illustrated in the process diagram 83, the thickness of the second protective layer 26 in the area A1 is adjusted to 50 nm.

Next, a second round of the Steps S2 and S3 will be described.

As illustrated in the process diagram 84, similar to the first round, a resist mask 47 having a predetermined opening is formed in the second round of Step S2. The opening in the resist mask 47 corresponds to a portion of the area A2.

In Step S3, similar to the first round, the resist mask 47 and the material layer 26p are subject to half etching. At this time, the material layer 26p is etched by a required amount through reliable time management. Specifically, the etching is complete at a time when the etching amount in the area A2 is 2 nm. The remaining resist mask 47 is then asked.

As a result, as illustrated in the process diagram 85, the thickness of the second protective layer 26 in the area A2 is adjusted to 52 nm and the thickness of the first adjustment layer is optimized for each display area. Specifically, the thickness of the second protective layer 26 is adjusted to 50 nm in the area A1, 52 nm in the area A2, and 54 nm in the area A3. These values are thicknesses reflecting the correction film thickness in the graph of FIG. 7.

Note that while three display areas are described here, the thickness of the first adjustment layer can be similarly adjusted per area when there are four or more display areas by repeating the Steps S2 and S3 the required number of times.

Effect of Area Division on Optical Path Length Setting

Figure 13:
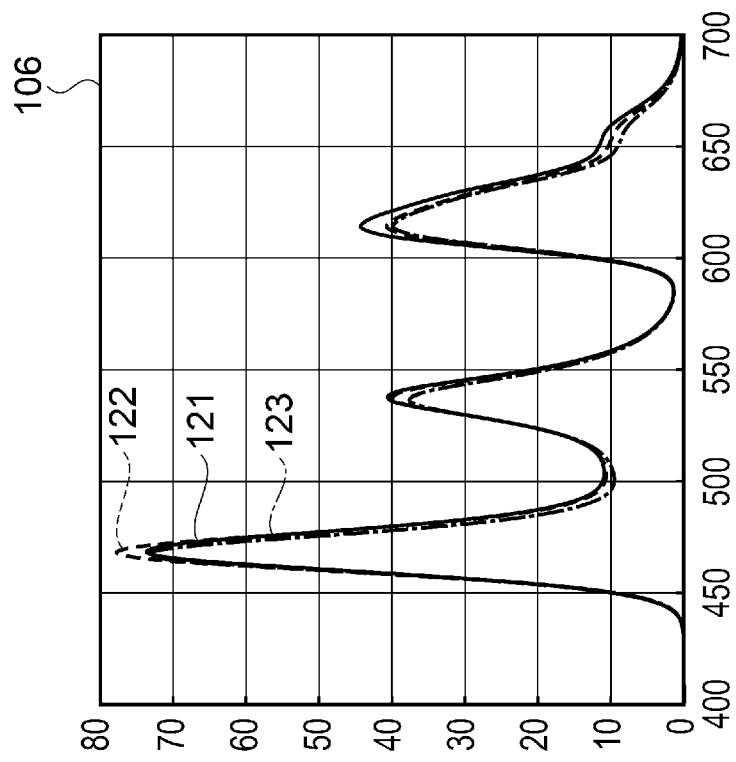
FIG. 13 is a graph showing distribution of intensity of wavelength components for each area.
Figure 13:
Figure 13:
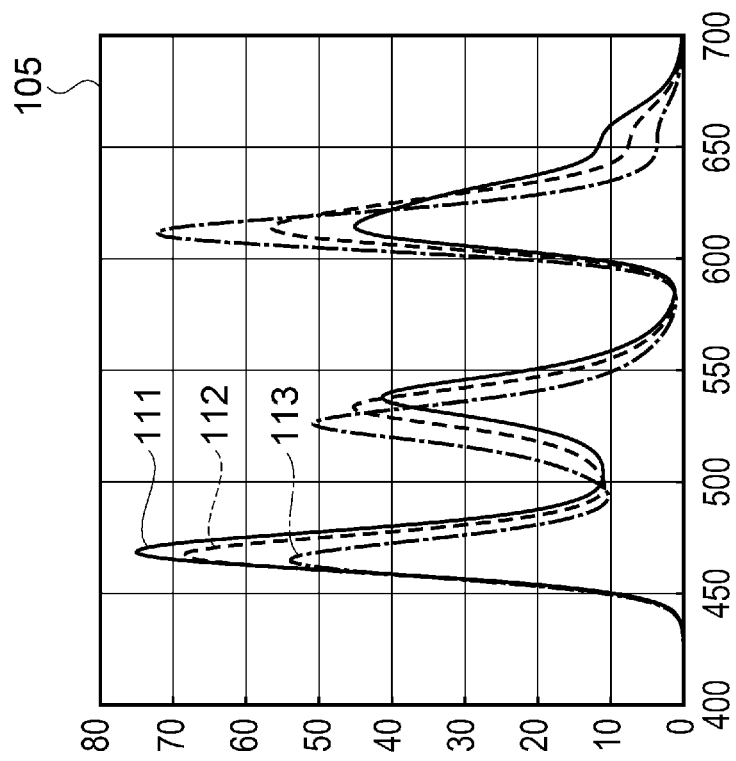

FIG. 13 is a graph showing distribution of intensity of wavelength components for each area. Graph 105 shows the optical spectrum of a typical display device, and graph 106 shows an optical spectrum achieved by an optical path length setting in the present embodiment. Both graphs show results of simulation by the present inventors. In the graphs 105 and 106, the horizontal axis represents the wavelength of light (nm) and the vertical axis represents light intensity (a.u.). As simulation conditions, the total number of areas n was 3. The angle of the principal ray in the reference area A1 of the display area was 0°, the angle of the principal ray in the area A2 outside the area A1 was 15°, and the angle of the principal ray in an area A3 outside the area A2 was 25°. Note that these spectra indicate the spectrum of white light emitted from the optical resonance structure of a representative sub-pixel in each area.

As shown in graph 105, in a typical display device, a spectrum shift occurs in an area where the angle of the principal ray is large, and this causes color shift to occur. Specifically, near 470 nm, which is the peak of blue light, a line segment 112 indicating the spectrum of the outer area A2 shifts further toward a side on which the peak value has a short wavelength than a line segment 111 indicating the spectrum of the reference area A1. Similarly, the peak value of a line segment 113 indicating the spectrum of an area A3 shifts further toward a shorter wavelength side than the line segment 112 of the area A2. The same applies to green light and red light.

That is, in a typical display device, color light shifts to the short wavelength side and chromaticity changes closer to the peripheral area where the principal ray angle is large.

In contrast, with a configuration based on the adjustment method for optical path length according to the present embodiment, as shown in graph 106, the spectra of the three areas substantially overlap and no color shift is observed. Specifically, near 470 nm, which is the peak of blue light, a line segment 121 indicating the spectrum of the reference area A1 and a line segment 122 indicating the spectrum of the outer area A2 substantially overlap and no shift in the peak value is observed. Similarly, a line segment 123 indicating the spectrum of the area A3 and the line segment 121 of the area A1 substantially overlap. In other words, the wavelength range of light emitted from a blue sub-pixel in the area A3 at a predetermined tilt angle of 25° is considered to substantially match the wavelength range of light emitted from a blue sub-pixel in the vertical direction in the area A1. The wavelength range of light emitted from a blue sub-pixel in the area A2 at a principal ray angle of 15° substantially matches the wavelength range of light emitted from a blue sub-pixel in the area A1 at a principal ray angle of 0°.

Similarly, near 540 nm, which is the peak of green light, the line segment 121 indicating the spectrum of the reference area A1 and the line segment 122 indicating the spectrum of the outer area A2 substantially overlap and no shift in the peak value is observed. Similarly, the line segment 123 indicating the spectrum of the area A3 also substantially overlaps the line segment 121 of the area A1. In other words, the wavelength range of light emitted from a green sub-pixel in the area A3 at a predetermined tilt angle of 25° substantially matches the wavelength range of light emitted from a green sub-pixel in the vertical direction in the area A1. The wavelength range of light emitted from a green sub-pixel in the area A2 at a principal ray angle of 15° substantially matches the wavelength range of light emitted from a green sub-pixel in the area A1 at a principal ray angle of 0°.

Similarly, near 620 nm, which is the peak of red light, the line segment 121 indicating the spectrum of the reference area A1 and the line segment 122 indicating the spectrum of the outer area A2 substantially overlap and no shift in the peak value is observed. Similarly, the line segment 123 indicating the spectrum of the area A3 also substantially overlaps the line segment 121 of the area A1. In other words, the wavelength range of light emitted from a red sub-pixel in the area A3 at a predetermined tilt angle of 25° substantially matches the wavelength range of light emitted from a red sub-pixel in the vertical direction in the area A1. The wavelength range of light emitted from a red sub-pixel in the area A2 at a principal ray angle of 15° substantially matches the wavelength range of light emitted from a red sub-pixel in the area A1 at a principal ray angle of 0°.

In other words, with a configuration based on the adjustment method for optical path length according to the present embodiment, it is found that chromaticity does not change even in the peripheral area where the principal ray angle is large.

Note that in the present embodiment, the first sub-pixel and the second sub-pixel are green sub-pixels. At this time, a first wavelength range is a range of from 495 nm to 570 nm, which is the approximate wavelength range of green light. The first sub-pixel and the second sub-pixel are not limited to a green sub-pixel and may be a blue sub-pixel or a red sub-pixel. When adopting blue sub-pixels, the first wavelength range is a range of from 430 nm to 495 nm, which is the approximate wavelength range of blue light. When adopting red sub-pixels, the first wavelength range is a range of from 580 nm to 750 nm, which is the approximate wavelength range of red light.

Figure 14:
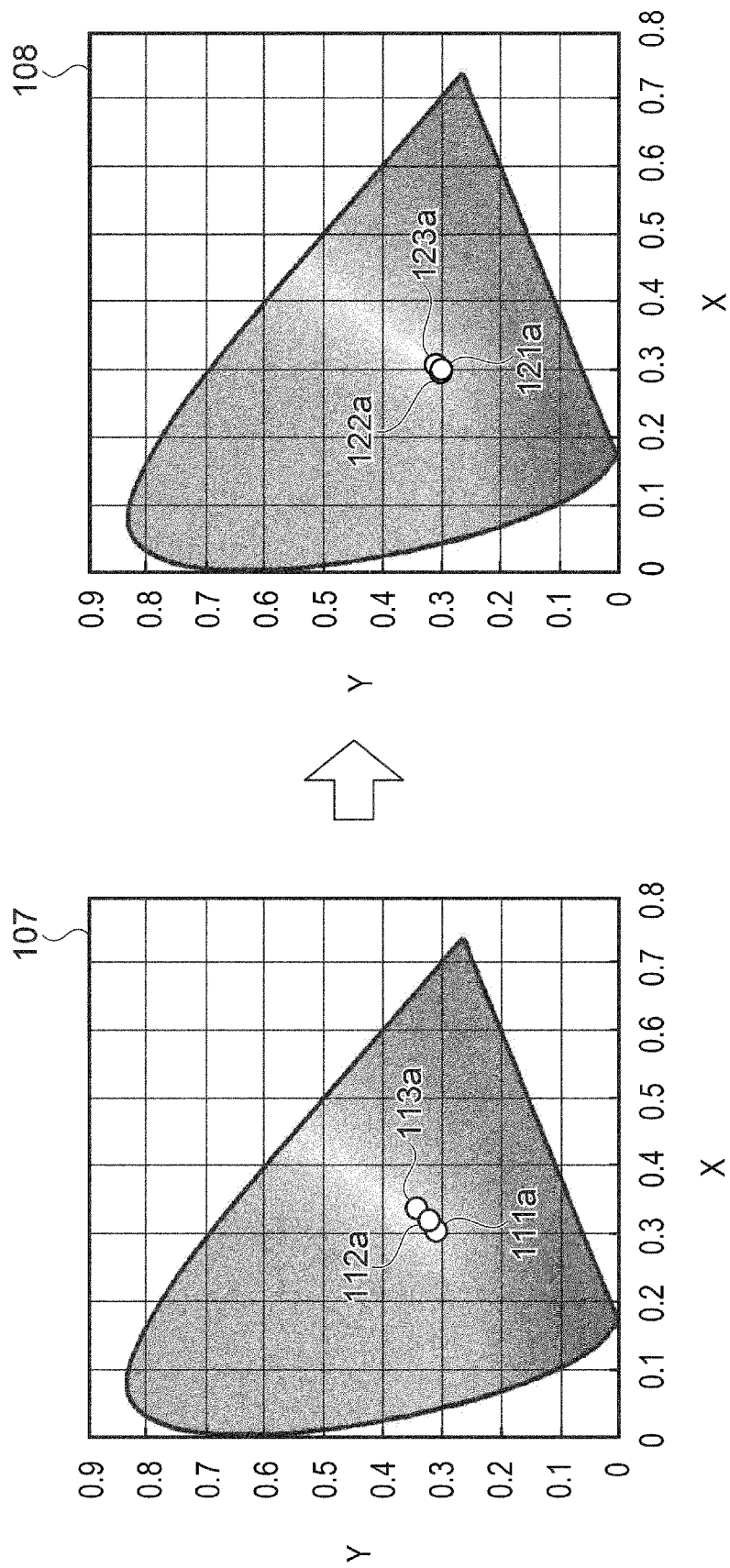
FIG. 14 is an XY chromaticity diagram showing chromaticity of a representative sub-pixel for each area.

FIG. 14 shows XY chromaticity diagrams illustrating the chromaticity of a representative sub-pixel for each area. Graph 107 shows chromaticity in a typical display device and graph 108 shows chromaticity with an optical path length setting according to the present embodiment. Both graphs are results of simulation conducted by the present inventors. FIG. 14 corresponds to FIG. 13, where graph 107 corresponds to graph 105 and graph 108 corresponds to graph 106. The simulation conditions are also identical to those in FIG. 13.

As shown in graph 107, in a typical display device, chromaticity shift occurs in an area where the principal ray angle is large. Specifically, a point 112*a* indicating chromaticity in the outer area A2 shifts toward the positive side of the XY coordinate, with a point 111*a* indicating chromaticity in the reference area A1 as a reference. Similarly, the peak value of a point 113*a* indicating chromaticity in the area A3 shifts further toward the positive side of both the X and Y coordinates than the point 112*a* of the area A2.

That is, in a typical display device, color light shifts to the short wavelength side and chromaticity changes as the area where the principal ray angle is large increases.

In contrast, when adopting a configuration based on the adjustment method for optical path length according to the present embodiment, as shown in graph 108, chromaticity of the three areas substantially overlap and no color shift is observed. Specifically, a point 121*a* indicating chromaticity of the reference area A1, a point 122*a* indicating chromaticity of the outer area A2, and a point 123*a* indicating chromaticity of the outer area A3 substantially overlap.

In other words, according to the configuration based on the adjustment method for optical path length according to the present embodiment, it is found that chromaticity does not change even in an area where the principal ray angle is large. As a result of verification by the present inventors based on these simulation results, employing the adjustment method for optical path length according to the present embodiment makes it possible to improve change in chromaticity by approximately 8% as compared to a typical display device.

Effects of First Embodiment

As described above, according to the organic EL device 100 and the manufacturing method thereof, the following effects can be obtained.

In the adjustment method for optical path length in an optical resonance structure, the display region is divided into a plurality of display areas based on the degree of tilt of the principal ray, display size, application, and other factors. By adjusting the thickness of the first adjustment layer based on the graph in FIG. 7, the optical path length for each display area can be optimized. As a result, the optical path length can be adjusted so that optical resonance conditions in a desired wavelength are satisfied even in areas where the principal ray is tilted. Specifically, the optical path lengths in display areas closer to peripheral sides are adjusted to be longer than the optical path length in the reference area.

Therefore, unlike a typical display device in which the optical path length becomes longer when the principal ray tilts and the resonance wavelength shifts to cause a change in chromaticity, the organic EL device 100 makes it possible to obtain a sharp image in which change in chromaticity is suppressed even in sub-pixels where the principal ray angle is large because the optical path length is optimized based on the number of stacked adjustment layers.

In a typical display device, when a display device that has a smaller planar size than the eyepiece is used, the angle of view increases and, in particular, a change in chromaticity occurs at the edges of the display area. In contrast, with the organic EL device 100, the optical path length can be optimized, and hence a change in chromaticity can be suppressed and sufficient visual field angle characteristics can be ensured even at edge portions of the display area. Specifically, adjustment is performed so as to increase the optical path length in display areas closer to peripheral sides at which the principal ray angle is large.

Even when the organic EL device 100 is smaller than the eyepiece lens and a large angle of view setting is used, the optical path length can be optimized throughout the display area, and it possible to meet the need for downsizing. In other words, an organic EL device 100 having a small size and excellent visual field angle characteristics can be provided.

With the manufacturing method according to the present embodiment, it is possible to adjust the thickness of the first adjustment layer in each of a plurality of display areas by selectively repeating half-etching on the material layer of the first adjustment layer according to the display area. In other words, performing a simple process of repeating half-etching on a material layer formed in one step makes it is possible to adjust the optical path length in a plurality of display areas.

Therefore, it is possible to provide a manufacturing method with few manufacturing processes and that can suppress manufacturing costs. Further, because the first adjustment layer made of a silicon nitride layer also functions as an etch stopper in the step of forming the second adjustment layer, the plurality of adjustment layers that constitute the second adjustment layer can be formed with good accuracy.

Accordingly, it is possible to provide a manufacturing method capable of accurately and efficiently adjusting the optical path length in individual display areas in the organic EL device 100 that has a plurality of display areas in which principal ray angles are different.

2. Second Embodiment

Division of Display Area

FIGS. 15 to 18 are diagrams illustrating division of display areas.

The first embodiment deals with an exemplary case where the display region is divided into two areas, but the present disclosure is not limited to this configuration. The display region may be divided into a plurality of areas depending on the application of the organic EL device 100, specifications and other factors. The same components as in the first embodiment are given the same reference signs, and redundant descriptions of these components will be omitted. Note that in the following description, the X direction is horizontal, the Y direction is vertical, the +X direction is right, the −X direction is left, the +Y direction is up and the −Y direction is down.

Figure 15:
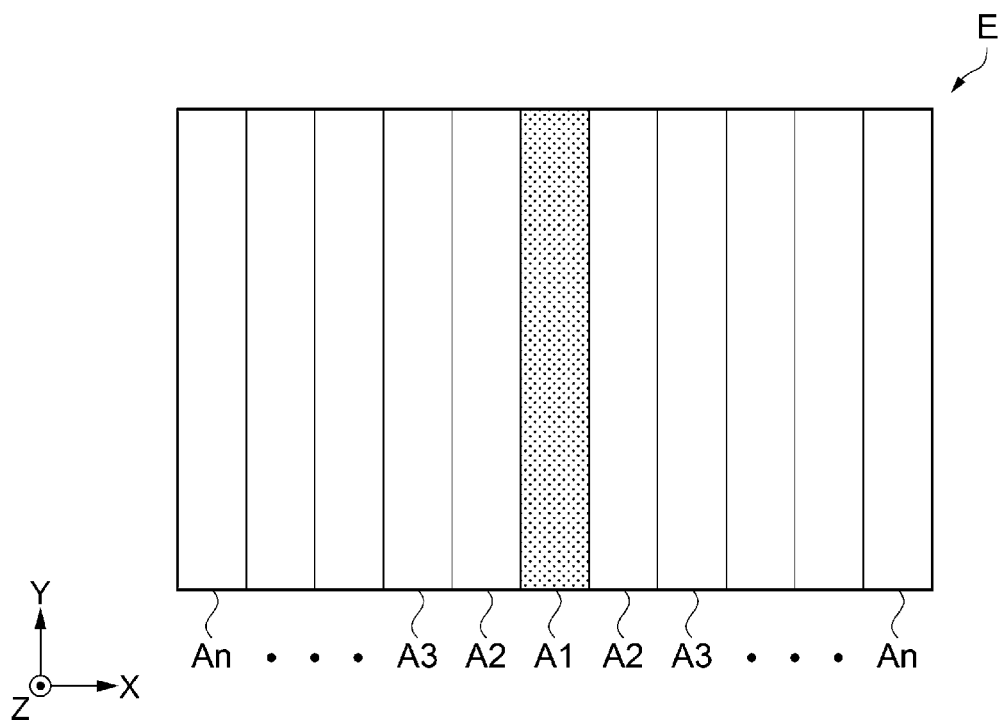
FIG. 15 is a diagram illustrating division of display areas.

In FIG. 15, the display region E of the organic EL device 100 is divided into n areas each having a vertical stripe shape. Specifically, with a center area of the display region E in the X direction defined as an area A1, the display region E is divided until an area An in the order of an area A2, an area A3 in the +X direction. The width of each area in the X direction is the same. Similarly, in the −X direction, the display region is divided from the area A1 serving as the reference area until an area An in the order of the area A2 and the area A3.

That is, peripheral areas are formed in vertical stripe shapes to the left and right of the area A1 until the area n.

Even when dividing the display region as described above, the thickness of the first adjustment layer can be adjusted for each area based on the graph in FIG. 7.

Figure 16:
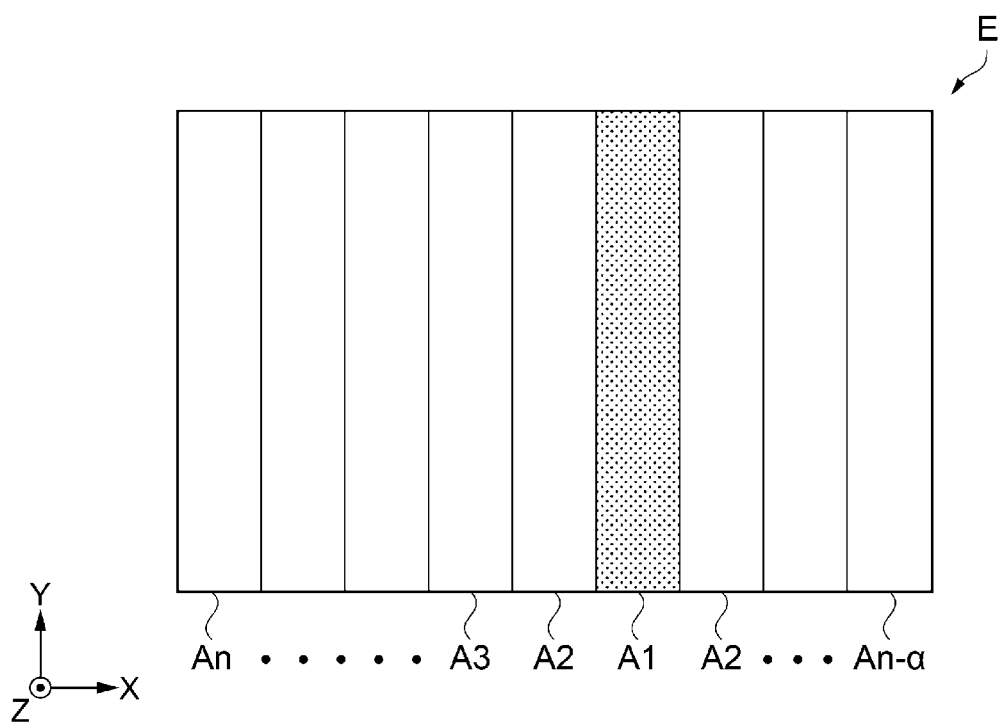
FIG. 16 is a diagram illustrating division of display areas.

In FIG. 16, the display region E is divided into n areas each having a vertical stripe shape similar to FIG. 15, but the position of the area A1 is shifted to the right. Specifically, the area A1 is slightly shifted in the +X direction from approximately the center of the display region E. From the area A1 as the reference area, the display region is divided into until the area An in the order of the area A2 and the area A3 in the −X direction. In the +X direction, the display region is divided from the area A1 until an area An−α.

Even when dividing the display region as described above, the thickness of the first adjustment layer can be adjusted for each area based on the graph in FIG. 7.

Note that FIGS. 15 and 16 illustrate a case where the display region E is divided into a plurality of areas each having a vertical stripe shape, but the display region E may be divided into lateral stripe shapes. Similarly, the position of the reference area A1 may be shifted from the center of the display region E.

Even when dividing the display region as described above, the thickness of the first adjustment layer can be adjusted for each area based on the graph in FIG. 7.

Figure 17:
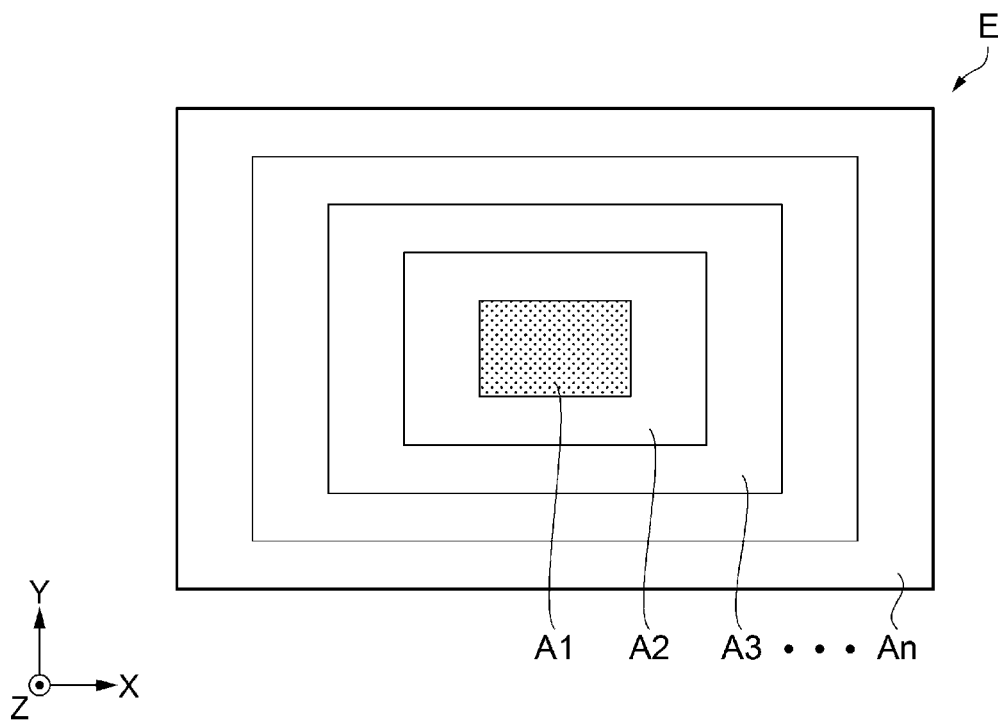
FIG. 17 is a diagram illustrating division of display areas.

In FIG. 17, the display region E is divided into n areas each having a rectangular ring shape. Specifically, the display region E is concentrically divided into areas by defining a long rectangular area at substantially the center of the display region E as an area A1, defining an area A2 having a similar rectangular shape around the area A1 that serves as a reference area, defining an area A3 having a similar rectangular shape around the area A2, and so on until an area An. The length between each of the peripheral areas may be equal or unequal. Note that the shape of each area may be an ellipse or a circle. If using ellipses or circles, the display region need only be divided into a plurality of areas concentrically.

Even when dividing the display region as described above, the thickness of the first adjustment layer can be adjusted for each area based on the graph in FIG. 7.

Figure 18:
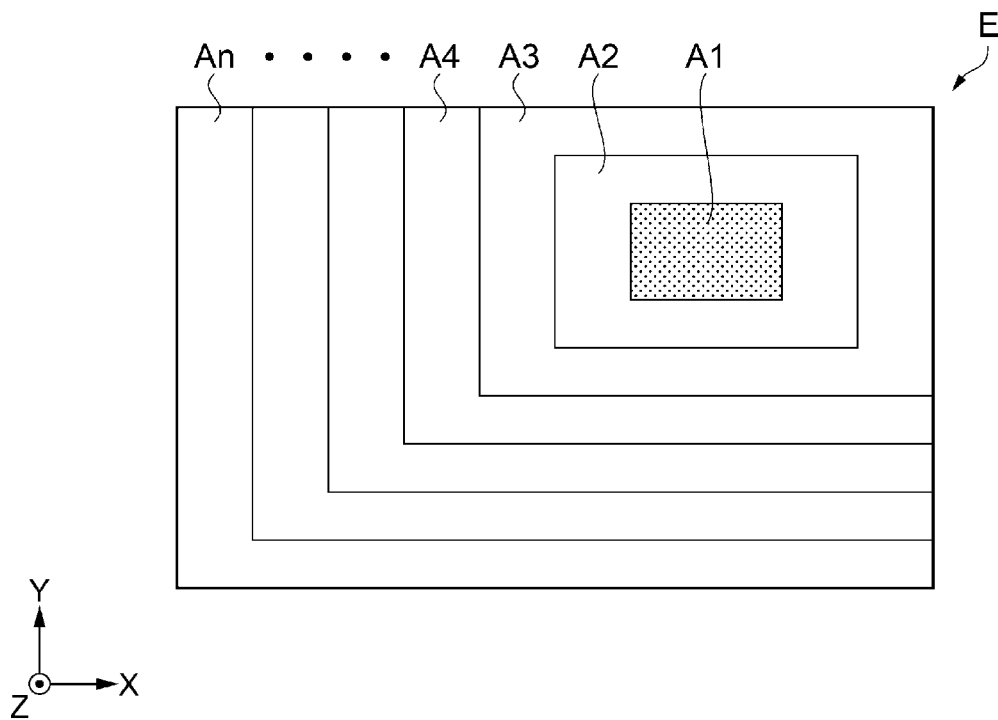
FIG. 18 is a diagram illustrating division of display areas.

In FIG. 18, the display region E is divided into n areas each having a rectangular ring shape similar to FIG. 17, but the position of the area A1 is shifted to the top right. Specifically, the area A1 is shifted in the +X direction and the +Y direction from approximately the center of the display region E. Thus, similar to in FIG. 17, the entire circumference of the rectangular shape increases concentrically with the area A1 as a reference until the area A3, but only the lower side and the left side increase from area A4. From the area A4, the upper side and the right side are fixed so that only the lower side and the left side become larger. Note that the shape of each area may be an ellipse or a circle. If using ellipses or circles, the display region need only be divided into a plurality of areas concentrically.

Even when dividing the display region as described above, the thickness of the first adjustment layer can be adjusted for each area based on the graph in FIG. 7.

Effects

Even when dividing the display region as described above, the thickness of the first adjustment layer can be adjusted for each area based on the graph in FIG. 7, similar to the first embodiment.

Accordingly, an organic EL device 100 exhibiting less change in chromaticity and excellent visual field angle characteristics can be provided.

The display region need only be divided into a plurality of display areas according to the degree of tilt of the principal ray, display size, application, and the like. Specifically, it is sufficient that a region where the principal ray is substantially perpendicular is defined as the reference area A1, and areas other than the area A1 be divided into a plurality of display areas according to the angle of the principal ray. As illustrated in FIGS. 16 and 18, the area A1 is not limited to being located at the center of the display region E and can be set to anywhere in the display region E. In particular, the display areas are preferably determined depending on the application and according to factors such as the type of HMD (see-through HMD, immersive HMD, etc.) and the differences between users such as gender and age.

4. Third Embodiment

Figure 19:
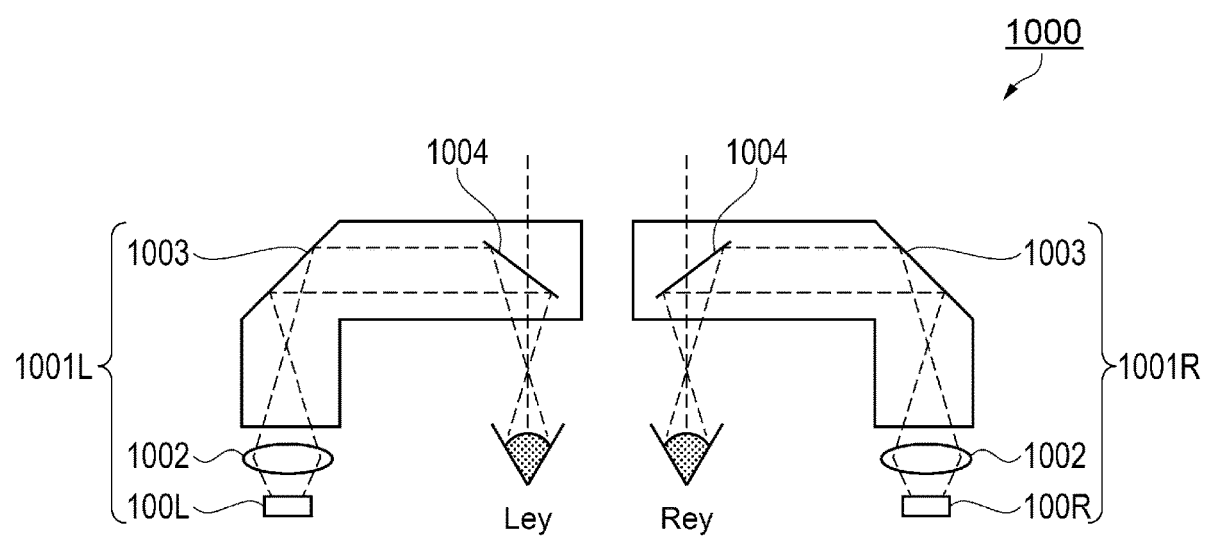
FIG. 19 is a schematic view illustrating a head-mounted display as an electronic apparatus.

FIG. 19 is a schematic diagram illustrating a head-mounted display as an example of an electronic apparatus.

An HMD 1000 is configured of a pair of optical units 1001L and 1001R used for displaying information corresponding to left and right eyes, respectively, mounting portions corresponding to eyeglass arms, a power supply unit, a control unit, and other components. Note that the mounting portion, the power supply unit and the control unit are not illustrated. Here, the pair of optical units 1001L and 1001R are configured to be horizontally symmetrical, and thus the optical unit 1001R configured for the right eye will be described as an example.

The optical unit 1001R includes a display unit 100R to which the organic EL device 100 of the above-described embodiment is applied, a light-converging optical system 1002 and an L-shaped light guide 1003. A half mirror layer 1004 is provided in the light guide 1003. In the optical unit 1001R, display light emitted from the display unit 100R converges at the light-converging optical system 1002 configured of a convex lens and is then incident on the light guide 1003 and reflected by the half mirror layer 1005 to be guided to a right eye Rey. The display light displays a virtual image in the half mirror layer 1004.

With such a configuration, the wearer of the HMD 1000 views a scene observed through the transparent light guide 1003 and a virtual image displayed on the half mirror layer 1004. In other words, the HMD 1000 is a see-through HMD.

The light guide 1003 is configured by combining rod lenses and forms a rod integrator. The light-converging optical system 1002 and the display unit 100R are arranged on the side of the light guide 1003 where light enters and have a configuration where the display light converged by the light-converging optical system 1002 is received by the rod lenses. Further, the half mirror layer 1004 of the light guide 1003 has an angle that reflects luminous flux toward the right eye Rey. Here, the luminous flux converges at the light-converging optical system 1002 and is totally reflected and transmitted within the rod lenses.

In this embodiment, the planar size of the display unit 100R is set to be smaller than the planar size of the light-converging optical system 1002. In order to obtain a large virtual image in a small display unit 100R, the angle of view needs to be increased. Therefore, in the display unit 100R, the display region is divided into a plurality of areas and the thickness of the first adjustment layer is adjusted for each area based on the graph in FIG. 7.

As described above, the optical unit 1001L for the left eye is the same as the optical unit 1001R for the right eye except that the optical unit 1001L includes a display unit 100L to which the organic EL device 100 of the above-described embodiment is applied, and configuration and functions are inverted relative to the optical unit 1001R.

Effects

As described above, the HMD 1000 includes the organic EL device 100 that is compact and has excellent visual field angle characteristics. Thus, a compact HMD 1000 that can achieve a large virtual image and has excellent visual field angle characteristics can be provided.

Note that the HMD 1000 to which the organic EL device 100 of the above-described embodiment is applied is not limited to a configuration including the pair of optical units 1001L and 1001R corresponding to both eyes. For example, the HMD 1000 may have a monocular configuration including only one of the optical units 1001R and 1001L. The HMD is furthermore not limited to a see-through HMD and may instead be an immersive HMD in which the display is viewed in a state where outside light is shielded.

The electronic apparatus provided with the organic EL device 100 of the above-described embodiment is not limited to a head-mounted display. The organic EL device 100 of the above-described embodiment can be suitably used as a display unit, such as a head-up display (HUD), an electronic viewfinder (EVF), and a portable information terminal.

Contents derived from the Embodiments will be described below.

A light-emitting device including a first sub-pixel and a second sub-pixel in a display region, the light-emitting device including a reflective layer, a semi-transmissive reflective layer, and a light-emitting functional layer provided between the reflective layer and the semi-transmissive reflective layer, the light-emitting device further including an optical resonance structure in which light radiated from the light-emitting functional layer resonates between the reflective layer and the semi-transmissive reflective layer, wherein a wavelength range of light, emitted by the first sub-pixel and the second sub-pixel, from the optical resonance structure is a first wavelength range, and moreover the light-emitting device further including a pixel electrode provided between the reflective layer and the light-emitting functional layer, and an insulating layer provided between the reflective layer and the pixel electrode, wherein the insulating layer in the second sub-pixel is thicker than the insulating layer in the first sub-pixel.

With this configuration, the optical path length in the optical resonance structure of the second sub-pixel is longer than the optical path length in the first sub-pixel. Here, in the display region, the first sub-pixel is disposed in the reference area and the second sub-pixel is disposed in an area other than the reference area. In other words, setting the optical path length of the second sub-pixel in an area other than the reference area to be longer than the optical path length of the first sub-pixel in the reference area sets the optical path length to an appropriate optical path length that satisfies optical resonance in a first wavelength range.

Thus, the optical path length is optimized in areas other than the reference area, and hence change in chromaticity can be suppressed and a light-emitting device that ensures sufficient visual field angle characteristics can be provided.

A light-emitting device including a first sub-pixel and a second sub-pixel in a display region, the light-emitting device including a reflective layer, a semi-transmissive reflective layer, and a light-emitting functional layer provided between the reflective layer and the semi-transmissive reflective layer, the light-emitting device further including an optical resonance structure in which light radiated from the light-emitting functional layer resonates between the reflective layer and the semi-transmissive reflective layer, wherein a wavelength range of light, emitted by the first sub-pixel and the second sub-pixel, from the optical resonance structure is a first wavelength range, and moreover the light-emitting device further including a pixel electrode provided between the reflective layer and the light-emitting functional layer, and an insulating layer provided between the reflective layer and the pixel electrode, wherein a wavelength range of light emitted at a predetermined tilt angle from the second sub-pixel matches a wavelength range of light emitted in a vertical direction from the first sub-pixel.

According to this configuration, the wavelength range of light emitted from the second sub-pixel at a predetermined principal ray angle matches the wavelength range of light emitted from the first sub-pixel in the vertical direction. Thus, because the first and second adjustment layers serve as insulating layers, the optical path length of the second sub-pixel is adjusted to an appropriate optical path length in a first wavelength range. Here, in the display region, the first sub-pixel is disposed in the reference area and the second sub-pixel is disposed in an area other than the reference area. In other words, the optical path length of a second sub-pixel at which the angle of the principal ray closer a peripheral side is large is set to be greater than the optical path length of a first sub-pixel at which the angle of the principal ray is small, to thereby set the optical path length to an appropriate optical path length that satisfies optical resonance in the first wavelength range.

Thus, the optical path length is optimized even in areas other than the reference area, and hence change in chromaticity can be suppressed and a light-emitting device that ensures sufficient visual field angle characteristics can be provided.

A light-emitting device, in which the insulating layer includes a first layer formed of a first material and a second layer formed of a second material, which is different from the first material, and the first layer in the second sub-pixel is thicker than the first layer in the first sub-pixel.

According to this configuration, the optical path length of the second sub-pixel can be adjusted to satisfy optical resonance by adjusting the thickness of the first adjustment layer functioning as the first layer in the second sub-pixel.

A light-emitting device in which a first sub-pixel is disposed in a reference area serving as a reference in a display region, and a second sub-pixel is disposed in an area, which is different from the reference area.

According to this configuration, optical path length is also optimized in a second sub-pixel located in an area different to the reference area of the display region, and hence change in chromaticity can be suppressed.

An electronic apparatus includes the above-described light-emitting device.

According to this configuration, an electronic apparatus capable of suppressing a change in chromaticity and ensuring sufficient visual field angle characteristics can be provided.

A method for manufacturing a light-emitting device including a first sub-pixel and a second sub-pixel in a display region, the light-emitting device including a reflective layer, an insulating layer, a light-emitting functional layer, and a semi-transmissive reflective layer in this order, the insulating layer including a first layer made of a first material and a second layer made of a second material, which is different from the first material, the light-emitting device further including an optical resonance structure in which light radiated from the light-emitting functional layer resonates between the reflective layer and the semi-transmissive reflective layer, the method including forming a material layer of the first layer in the insulating layer, forming a first resist mask at the material layer of the first layer, half-etching the material layer of the first layer through the first resist mask to form the first layer, forming a material layer of the second layer at the first layer, forming a second resist mask at the material layer of the second layer, and etching the material layer of the second layer through the second resist mask to form the second layer, wherein the first layer in a second sub-pixel disposed in an area different from a reference area serving as a reference in the display region is thicker than the first layer in a first sub-pixel disposed in the reference area.

According to this manufacturing method, by selectively repeating half-etching on the material layer of the first adjustment layer functioning as a first layer according to the display area, the thickness of the first adjustment layer can be adjusted for each of the plurality of display areas. As a result, the thickness of the first adjustment layer functioning as an adjustment layer for optical path length can be selectively formed separately between the reference area and the peripheral area. Thus, the thickness of the first adjustment layer in the second sub-pixel disposed in a peripheral area can be made thicker than the thickness of the first adjustment layer in the first sub-pixel disposed in the reference area.

Thus, it is possible to provide a method for manufacturing a light-emitting device capable of optimizing optical path length in both a reference area and peripheral side portions of a display region.

What is claimed is:

1. A light-emitting device comprising:
   a semi-transmissive reflection layer;
   a first reflection layer that is disposed in a first sub-pixel;
   a first pixel electrode that is disposed in the first sub-pixel;
   a first color filter that is disposed in the first sub-pixel, and that is disposed on an opposite-side of the semi-transmissive reflection layer from the first reflection layer;
   a second reflection layer that is disposed in a second sub-pixel;
   a second pixel electrode that is disposed in the second sub-pixel;
   a second color filter that is disposed in the second sub-pixel, and that is disposed on an opposite-side of the semi-transmissive reflection layer from the second reflection layer, and that is same color as the first color filter;
   a light-emitting functional layer that is disposed between the first reflection layer and the semi-transmissive reflection layer, and that is disposed between the second reflection layer and the semi-transmissive reflection layer; and
   an insulating layer that is disposed between the first reflection layer and the first pixel electrode, and that is disposed between the second reflection layer and the second pixel electrode, wherein
      the first pixel electrode is disposed between the first reflection layer and the light-emitting functional layer,
      the second pixel electrode is disposed between the second reflection layer and the light-emitting functional layer,
      a thickness of the insulating layer in the second sub-pixel is thicker than a thickness of the insulating layer in the first sub-pixel,
      the insulating layer having a first layer including a first material and a second layer including a second material which is different from the first material, and
      a thickness of the first layer in the second sub-pixel is thicker than a thickness of the first layer in the first sub-pixel.

2. The light-emitting device according to claim 1, wherein the first sub-pixel is arranged in a center of a display region more than the second sub-pixel.

3. An electronic apparatus comprising the light-emitting device of claim 1.

4. A light-emitting device comprising:
   a semi-transmissive reflection layer;
   a first reflection layer that is disposed in a first sub-pixel;
   a first pixel electrode that is disposed in the first sub-pixel;
   a second reflection layer that is disposed in a second sub-pixel, the second sub-pixel that emits same color light as the first sub-pixel;
   a second pixel electrode that is disposed in the second sub-pixel;
   light-emitting functional layer that is disposed between the first reflection layer and the semi-transmissive reflection layer, and that is disposed between the second reflection layer and the semi-transmissive reflection layer; and
   an insulating layer that is disposed between the first reflection layer and the first pixel electrode, and that is disposed between the second reflection layer and the second pixel electrode, wherein
      the first pixel electrode is disposed between the first reflection layer and the light-emitting functional layer,
      the second pixel electrode is disposed between the second reflection layer and the light-emitting functional layer,
      a thickness of the insulating layer in the second sub-pixel is thicker than a thickness of the insulating layer in the first sub-pixel,
      the insulating layer having a first layer including a first material and a second layer including a second material which is different from the first material, and
      a thickness of the first layer in the second sub-pixel is thicker than a thickness of the first layer in the first sub-pixel.

5. The light-emitting device according to claim 4, wherein the first sub-pixel is arranged in a center of a display region more than the second sub-pixel.

6. A light-emitting device comprising:
   a semi-transmissive reflection layer;
   a first reflection layer that is disposed in a first sub-pixel;
   a first pixel electrode that is disposed in the first sub-pixel;
   a second reflection layer that is disposed in a second sub-pixel, the second sub-pixel that emits same color light as the first sub-pixel;
   a second pixel electrode that is disposed in the second sub-pixel;
   a light-emitting functional layer that is disposed between the first reflection layer and the semi-transmissive reflection layer, and that is disposed between the second reflection layer and the semi-transmissive reflection layer; and
   an insulating layer that is disposed between the first reflection layer and the first pixel electrode, and that is disposed between the second reflection layer and the second pixel electrode, wherein
      the first pixel electrode is disposed between the first reflection layer and the light-emitting functional layer,
      the second pixel electrode is disposed between the second reflection layer and the light-emitting functional layer,
      the first sub-pixel is disposed closer to a center of a display region than the second sub-pixel,
      the insulating layer has a first layer including silicon nitride and a second layer including silicon nitride, and
      a thickness of the first layer in the second sub-pixel is thicker than a thickness of the first layer in the first sub-pixel.

7. The light-emitting device according to claim 6, wherein
   a first surface of the insulating layer that faces the first reflection layer is planar and a second surface of the insulating layer that faces the light-emitting functional layer has a step shape.

* * * * *